(12) United States Patent
Johnson et al.

(10) Patent No.: US 7,552,406 B2
(45) Date of Patent: Jun. 23, 2009

(54) INCORPORATION OF UNCERTAINTY INFORMATION IN MODELING A CHARACTERISTIC OF A DEVICE

(75) Inventors: Jeffrey B. Johnson, Essex Junction, VT (US); Bartholomew Martin, Jr., Staatsburg, NY (US)

(73) Assignee: International Business Machines Corporation, Armonk, NY (US)

(*) Notice: Subject to any disclaimer, the term of this patent is extended or adjusted under 35 U.S.C. 154(b) by 177 days.

(21) Appl. No.: 11/677,666

(22) Filed: Feb. 22, 2007

(65) Prior Publication Data

US 2007/0143084 A1 Jun. 21, 2007

Related U.S. Application Data

(62) Division of application No. 10/710,733, filed on Jul. 30, 2004, now Pat. No. 7,216,313.

(51) Int. Cl.
| | |
|---|---|
| G06F 17/50 | (2006.01) |
| G06F 19/00 | (2006.01) |
| G06F 17/11 | (2006.01) |
| G06F 17/15 | (2006.01) |
| G06F 17/16 | (2006.01) |
| G06F 17/17 | (2006.01) |
| G06F 17/18 | (2006.01) |

(52) U.S. Cl. .................. 716/4; 703/1; 703/2; 703/14
(58) Field of Classification Search .................. 716/4; 703/1, 2, 14
See application file for complete search history.

(56) References Cited

U.S. PATENT DOCUMENTS 4,090,242 A 5/1978 Lerma et al.

(Continued)

FOREIGN PATENT DOCUMENTS

EP 328064 A2 8/1989

OTHER PUBLICATIONS

Bell et al., "A Bayesian Approach to Robust Adaptive Beamforming", IEEE Transactions on Signal Processing, vol. 48, No. 2, Feb. 2000, pp. 386-398.*

(Continued)

*Primary Examiner*—Phallaka Kik
(74) *Attorney, Agent, or Firm*—Schmeiser, Olsen & Watts; Richard M. Kotulak

(57) ABSTRACT

A method and model for modeling a characteristic C that is distributed within a domain. A provided base equation expresses C as a function $f$ of a variable V through use of N+1 parameters $C_0, C_1, \ldots, C_N$ in the form $C=f(C_0, C_1, \ldots, C_N, V)$, wherein $N \geq 1$, and wherein $C_0, C_1, \ldots, C_N$ are subject to uncertainty. A probability density function (PDF) is provided for describing the probability of occurrence of $C_0$ in accordance with the uncertainty. Subsidiary equations expressing $C_1, \ldots, C_N$ in terms of $C_0$ are provided. A value of C may be sampled by: providing a value V' of V; picking a random value $C_{0R}$ of $C_0$ from the PDF; computing values $C_{1R}, \ldots, C_{NR}$ of $C_1, \ldots, C_N$, respectively, by substituting $C_{0R}$ into the subsidiary equations; and calculating C by substituting $C_{0R}, C_{1R}, \ldots, C_{NR}$ and V' into the base equation.

33 Claims, 11 Drawing Sheets

U.S. PATENT DOCUMENTS

| | | | |
|---|---|---|---|
| 5,307,296 | A | 4/1994 | Uchida et al. |
| 5,351,197 | A | 9/1994 | Upton et al. |
| 5,359,535 | A | 10/1994 | Djaja et al. |
| 5,365,463 | A | 11/1994 | Donath et al. |
| 5,481,475 | A | 1/1996 | Young |
| 5,559,715 | A | 9/1996 | Misheloff |
| 5,590,051 | A | 12/1996 | Yokozawa |
| 5,761,481 | A | 6/1998 | Kadoch et al. |
| 5,883,818 | A | 3/1999 | Salimi et al. |
| 5,886,906 | A | 3/1999 | Tatsumi et al. |
| 5,966,527 | A | 10/1999 | Krivokapic et al. |
| 6,194,670 | B1 | 2/2001 | Reichmuth et al. |
| 6,246,975 | B1 * | 6/2001 | Rivonelli et al. ............. 703/11 |
| 6,389,577 | B1 | 5/2002 | Kodali et al. |
| 6,507,936 | B2 | 1/2003 | Yamaguchi |
| 6,567,773 | B1 | 5/2003 | Rahmat et al. |
| 6,711,529 | B1 * | 3/2004 | Thore ............................ 703/2 |
| 6,820,044 | B2 * | 11/2004 | Groen et al. ................... 703/2 |
| 7,000,205 | B2 * | 2/2006 | Devgan et al. ................. 716/6 |
| 2003/0110018 | A1 * | 6/2003 | Dutta et al. .................... 703/10 |
| 2004/0002838 | A1 * | 1/2004 | Oliver et al. ................... 703/2 |
| 2004/0220790 | A1 * | 11/2004 | Cullick et al. ................. 703/10 |
| 2004/0243954 | A1 * | 12/2004 | Devgan et al. ................. 716/6 |
| 2006/0004608 | A1 | 1/2006 | Rovinelli et al. |
| 2006/0031050 | A1 * | 2/2006 | Bolch et al. ................... 703/11 |

OTHER PUBLICATIONS

Cox et al.; Interactive Device Analysis System; IBM Technical Disclosure Bulletin, vol. 20, No. 1, Jun. 1977; pp. 164-165.

Savkar; Random Delay Simulation; IBM Technical Disclosure Bulletin, vol. 19, No. 11, Apr. 1977; pp. 4257-4258.

Chao et al.; Distributions with Fuzziness and Randomness; The Third International Symposium on Uncertainty Modeling and Analysis and Annual Conference of the North American Fuzzy Information Processing Society, Sep. 17, 1995; pp. 668-673.

Candela et al.; Propagation of Uncertainty in Bayesian Kernel Models—Application to Multiple-Step Ahead Forecasting; 2003 IEEE International Conference on Acoustics, Speech, and Signal Processing, vol. 2; pp. II-701-704.

Okashah et al.; Unknown Unknowns: Modeling Unanticipated Events; Winter Simulation Conference Proceedings, Dec. 11, 1994; pp. 689-694.

Betz et al.; Representation and Transformation of Uncertainty in an Evidence Theory Framework; IEEE Computer Society Conference on Computer Vision and Pattern Recognition, Jun. 4, 1989; pp. 646-652.

Hall et al.; Covariance Averaging in the Analysis of Uncertain Systems; IEEE Transactions on Automatic Control, vol. 38, No. 12, Dec. 1993; pp. 1858-1862.

Arbel et al.; Recognizing Volumetric Objects in the Presence of Uncertainty; Proceedings of the 12th IAPR International Conference on Pattern Recognition, vol. 1, Oct. 9, 1994; pp. 470-476.

Devgan et al.; Block-based Static Timing Analysis with Uncertainty; International Conference on Computer Aided Design, Nov. 9, 2003; pp. 607-614.

Garrison et al.; Model Function Development for GPS Reflection Measurements; 2002 IEEE International Geoscience and Remote Sensing Symposium, vol. 2, Jun. 24, 2002; pp. 1293-1295.

* cited by examiner

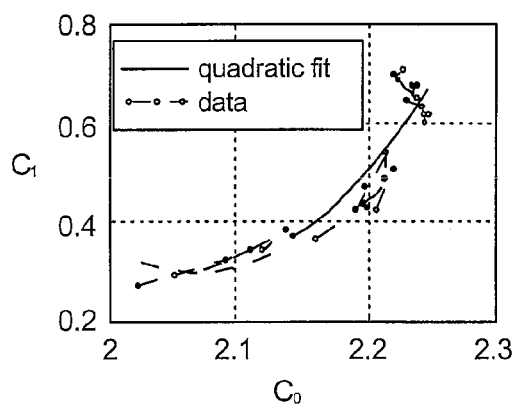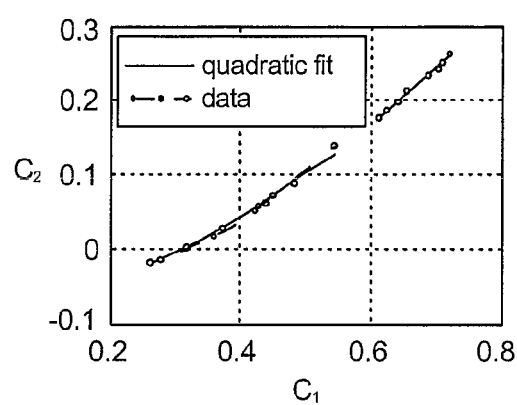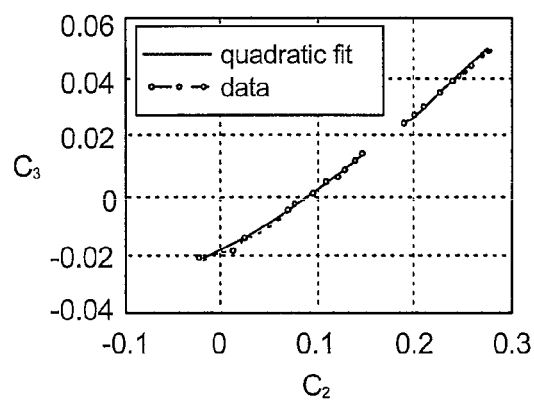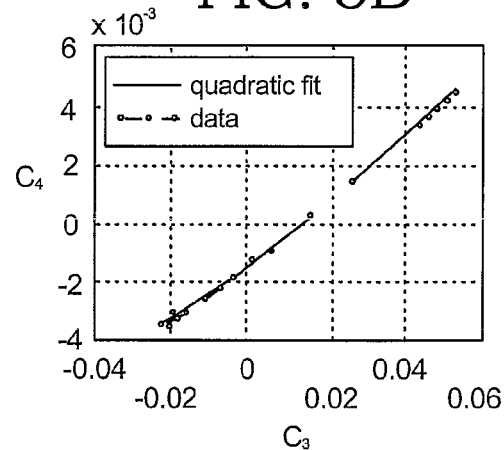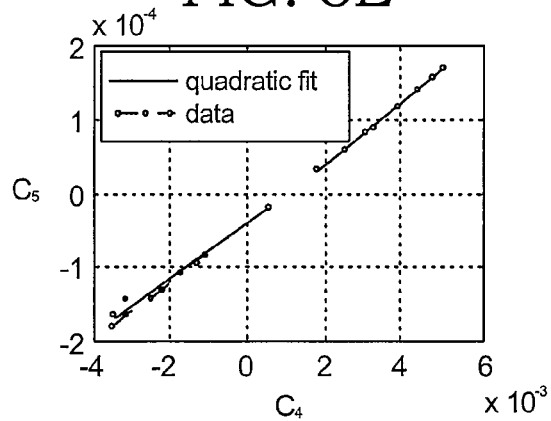

INCORPORATION OF UNCERTAINTY INFORMATION IN MODELING A CHARACTERISTIC OF A DEVICE

This application is a divisional of Ser. No. 10/710,733, now U.S. Pat. No. 7,216,313, filed Jul. 30, 2004.

BACKGROUND OF THE INVENTION

1. Technical Field

The present invention relates to a method and model for incorporating uncertainty in modeling a characteristic of a design.

2. Related Art

An integrated circuit is subject to process variations that occur during manufacture of integrated circuits. Circuit designers currently assess the effect these process variations on performance characteristics of integrated circuits by methods which do not yield sufficiently accurate assessments. Thus, there is a need for a method that assesses the effect of process variations on performance characteristics of integrated circuits more accurately than is accomplished in the related art.

SUMMARY OF THE INVENTION

The present invention provides a method for modeling a characteristic C that is distributed within a domain, said method comprising:

providing a base equation expressing the characteristic C as a function f of a variable V through use of N+1 parameters $C_0, C_1, \ldots, C_N$, said base equation being of the form $C=f(C_0, C_1, \ldots, C_N, V)$, said N being at least 1, said parameters $C_0, C_1, \ldots, C_N$ being subject to uncertainty;

providing a probability density function (PDF) for describing the probability of occurrence of $C_0$ in accordance with said uncertainty; and providing subsidiary equations expressing $C_1, \ldots, C_N$ in terms of $C_0$.

The present invention provides a method for modeling a characteristic C that is distributed within a domain, said characteristic C having J subcharacteristics $S_1, S_2, \ldots, S_J$, said method comprising:

providing a combination equation that expresses C as a function F of the J subcharacteristics, said J being at least 2;

providing base equations expressing $S_j$ as a function $f_j$ of a variable V through use of N+1 parameters $S_{j0}, S_{j1}, \ldots, S_{jN}$, said base equations being of the form $S_j=f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

providing at least one probability density function (PDF) from $PDF_1, PDF_2, \ldots, PDF_J$, said $PDF_n$ describing the probability of occurrence of $S_{n0}$ in accordance with said uncertainty for $n=1, 2, \ldots, J$, said at least one PDF including $PDF_1$;

for each $PDF_n$ not provided: providing an auxiliary equation $E_n$ expressing $S_{n0}$ in terms of $S_{10}$; and providing subsidiary equations expressing $S_{j1}, \ldots, S_{jN}$ in terms of $S_{j0}$ for each subcharacteristic $S_j$ of the J subcharacteristics.

The present invention provides a computer program product, comprising a computer usable medium having a computer readable program code embodied therein, said computer readable program code adapted to be executed on a processor for implementing a method for modeling a characteristic C that is distributed within a domain, said method comprising:

providing a base equation expressing the characteristic C as a function f of a variable V through use of N+1 parameters $C_0, C_1, \ldots, C_N$, said base equation being of the form $C=f(C_0, C_1, \ldots, C_N, V)$, said N being at least 1, said parameters $C_0, C_1, \ldots, C_N$ being subject to uncertainty;

providing a probability density function (PDF) for describing the probability of occurrence of $C_0$ in accordance with said uncertainty; and providing subsidiary equations expressing $C_1, \ldots, C_N$ in terms of $C_0$.

The present invention provides a computer program product, comprising a computer usable medium having a computer readable program code embodied therein, said computer readable program code adapted to be executed on a processor for implementing a method for modeling a characteristic C that is distributed within a domain, said characteristic C having J subcharacteristics $S_1, S_2, \ldots, S_J$, said method comprising:

providing a combination equation that expresses C as a function F of the J subcharacteristics, said J being at least 2;

providing base equations expressing $S_j$ as a function $f_j$ of a variable V through use of N+1 parameters $S_{j0}, S_{j1}, \ldots, S_{jN}$, said base equations being of the form $S_j=f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

providing at least one probability density function (PDF) from $PDF_1, PDF_2, \ldots, PDF_J$, said $PDF_n$ describing the probability of occurrence of $S_{n0}$ in accordance with said uncertainty for $n=1, 2, \ldots, J$, said at least one PDF including $PDF_1$;

for each $PDF_n$ not provided: providing an auxiliary equation $E_n$ expressing $S_{n0}$ in terms of $S_{10}$; and providing subsidiary equations expressing $S_{j1}, \ldots, S_{jN}$ in terms of $S_{j0}$ for each subcharacteristic $S_j$ of the J subcharacteristics.

The present invention provides a model, comprising:

a base equation expressing a characteristic C as a function f of a variable V through use of N+1 parameters $C_0, C_1, \ldots, C_N$, said base equation being of the form $C=f(C_0, C_1, \ldots, C_N, V)$, said N being at least 1, said parameters $C_0, C_1, \ldots, C_N$ being subject to uncertainty, said characteristic C being distributed within a domain;

a probability density function (PDF) for describing the probability of occurrence of $C_0$ in accordance with said uncertainty; and subsidiary equations expressing $C_1, \ldots, C_N$ in terms of $C_0$.

The present invention provides a model, comprising:

a combination equation that expresses C as a function F of the J subcharacteristics, said J being at least 2, said characteristic C being distributed within a domain, said characteristic C having J subcharacteristics $S_1, S_2, \ldots, S_J$;

base equations expressing $S_j$ as a function $f_j$ of a variable V through use of N+1 parameters $S_{j0}, S_{j1}, \ldots, S_{jN}$, said base equations being of the form $S_j=f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

at least one probability density function (PDF) from $PDF_1, PDF_2, \ldots, PDF_J$, said $PDF_n$ describing the probability of occurrence of $S_{n0}$ in accordance with said uncertainty for $n=1, 2, \ldots, J$, said at least one PDF including $PDF_1$;

for each $PDF_n$ that does not exist: an auxiliary equation $E_n$ expressing $S_{n0}$ in terms of $S_{10}$; and subsidiary equations expressing $S_{j1}, \ldots, S_{jN}$ in terms of $S_{j0}$ for each subcharacteristic $S_j$ of the J subcharacteristics.

The present invention provides a method that assesses the effect of process variations on performance characteristics of integrated circuits more accurately than is accomplished in the related art.

BRIEF DESCRIPTION OF THE DRAWINGS

FIGS. 3A-3E depict curves relating parameters used for modeling the capacitance of a varactor with each other, in accordance with embodiments of the present invention.

DETAILED DESCRIPTION OF THE INVENTION

Figure 1:
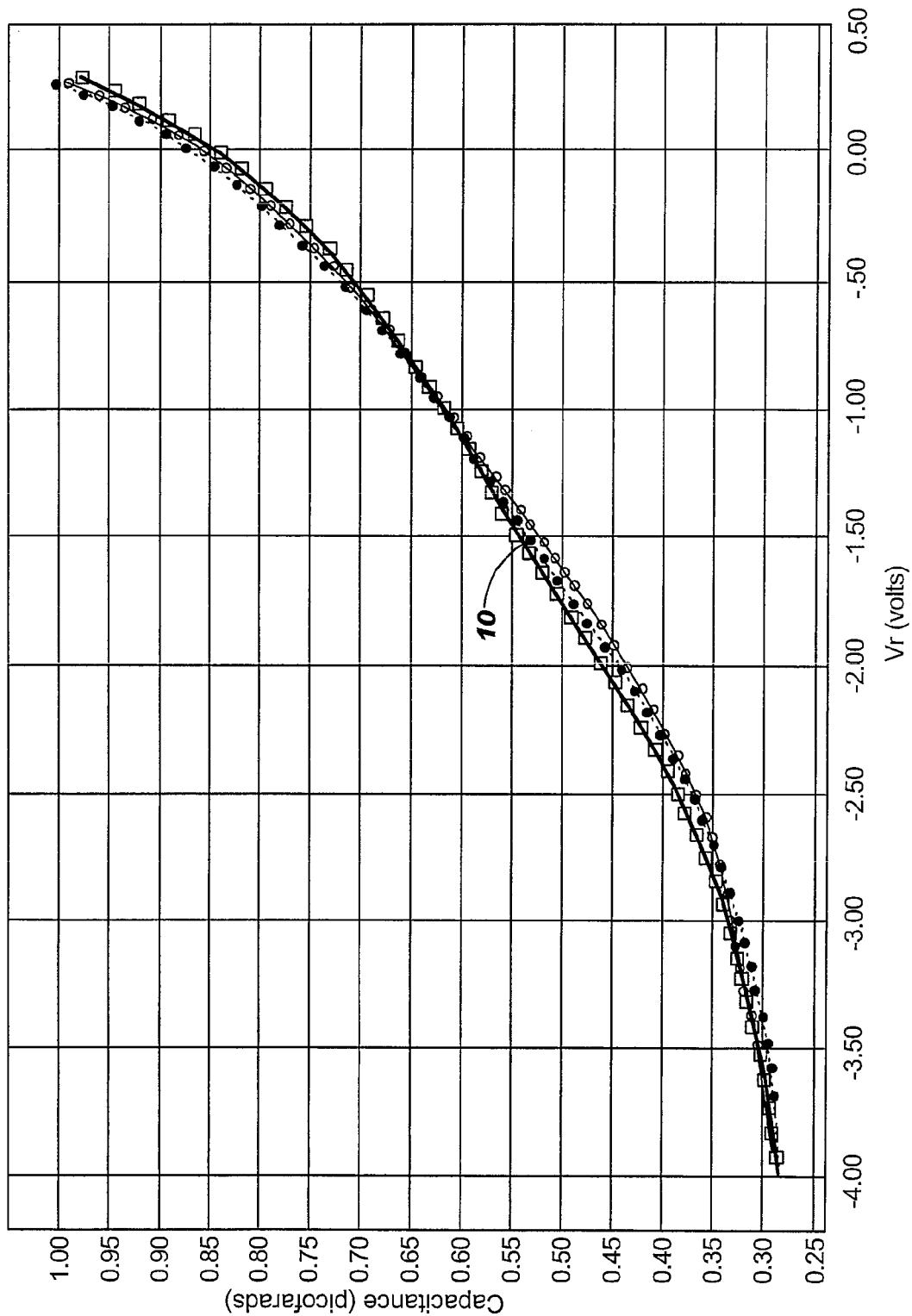
FIG. 1 depicts a nominal curve of capacitance versus applied voltage of a varactor fitted to a fifth order polynomial in the applied voltage, in accordance with embodiments of the present invention.

The present invention relates to the design of a physical system comprising devices therein such that characteristics of the devices are subject to uncertainty. For example, a physical system may comprise integrated circuits on a semiconductor wafer, wherein characteristics (e.g., capacitance) of devices (e.g., virtual capacitors) on the wafer may be subject to uncertainty due to process variations that occur during manufacturing of the integrated circuits on the semiconductor wafer. To confirm that such a design is acceptable, the designer (e.g., the integrated circuit designer) may assess the design by computerized simulation of the system for determining whether performance characteristics of the system are within acceptable limits. For integrated circuit design, such performance characteristics may include, inter alia, signal transmission speed, signal switching speed, operating temperature, power output, power conversion efficiency, the logical correctness of a logic circuit, etc. The computerized simulation takes into account the uncertainty, such as uncertainty due to process variations, in the device characteristics by the methodology of the present invention. The uncertainties are modeled by one or more probability density functions, such as a normal probability distribution characterized by a mean and a standard deviation. In addition to capacitance, other examples of device characteristics in electrical systems include, inter alia, the resistance of a metal line, the inductance of an inductor, and the threshold voltage of a transistor.

The subsequent description of the present invention is divided into four segments. The first segment illustrates the present invention by discussing the modeling of the characteristic C of the capacitance of a varactor, which is a capacitor whose capacitance varies with the applied voltage. The second segment formulates the present invention generally by discussing the modeling of a characteristic C that is distributed within a domain, wherein C is not expressed in terms of any subcharacteristics of C, as embodied in Equation (2) discussed infra. The third segment formulates the present invention generally by discussing the modeling of a characteristic C that is distributed within a domain, wherein C is expressed in terms of a plurality of subcharacteristics of C, as embodied in Equation (3) discussed infra. The fourth segment describes a computer system that may be utilized to implement algorithms of the present invention.

Modeling the Capacitance of a Varactor

A particular example of a device in an integrated circuit is a varactor built in a semiconductor via by implanting and diffusing dopant impurities to create a p-n junction. Such a varactor may be described by Equation (1):

$$C=C_0/(1-V/V_B)^m \quad (1)$$

where C is the capacitance of the varactor, $V_B$ is the 'built-in' voltage ($V_B$>0), V is the applied voltage at the varactor (V<0), and m is the "grading coefficient" (m>0). Note that $C=C_0$ if $V=V_0=0$. The use of the variable "C" for capacitance in Equation (1) and similar equations should not be confused with the use of "C" as representing a characteristic generally in the description of the present invention herein; e.g., in Equation (6) described infra. The context of the pertinent description in which "C" appears makes it clear when "C" represents capacitance and when "C" represents a characteristic generally.

The varactor described by Equation (1) is a "virtual capacitor" as contrasted with a physical capacitor that has two conducting plates separated by a dielectric medium such as air. A virtual capacitor has virtual capacitor plates with an effective area and an effective perimeter. For the case of virtual capacitance caused by dopant concentrations in semiconductors, the effective plate area represents the region of the p-n junction having uniform depth, and the effective plate perimeter represents the regions of the diffused p-n junction which is not of uniform depth, typically on the edges of the diffused region. A real or virtual capacitor may be characterized by an area capacitance and a perimeter capacitance. Area capacitance is defined as capacitance per unit area of a physical capacitor plate if the capacitor is a physical capacitor, or the capacitance per unit effective area of a virtual capacitor plate if the capacitor is a virtual capacitor. Perimeter capacitance is defined as capacitance per unit perimeter of a physical capacitor plate if the capacitor is a physical capacitor, or the capacitance per unit effective perimeter of a virtual capacitor plate if the capacitor is a virtual capacitor. Generally, the scope of the present invention includes both physical devices and virtual devices.

In Equation (1), the parameters $C_0$, $V_B$, and m are subject to uncertainty, such as due to process variations, and are modeled statistically in accordance with the present invention. Note that Equation (1) has a physical basis for describing the capacitance C of a varactor and may accurately describe a varactor in many situations. In some situation, however, an equation with more adjustable parameters than the three parameters ($C_0$, $V_0$, and m) in Equation (1) may be useful for fitting measured capacitances. Accordingly, Equation (2) describes the capacitance C of a particularly useful varactor, namely a hyperabrupt varactor, using a fifth order polynomial in V with fitting six coefficients of $C_0$, $C_1$, $C_2$, $C_3$, $C_4$, and $C_5$.

$$C=C_0(1+C_1V+C_2V^2+C_3V^3+C_4V^4+C_5V^5) \qquad (2)$$

Note that $C=C_0$ if $V=V_0=0$. As in Equation (1), V is the applied voltage. Unlike Equation (1), the fifth order polynomial in V of Equation (2) has no physical basis for describing the hyperabrupt varactor and is utilized because the fifth order polynomial in Equation (2) can be accurately fitted to measured total capacitances of hyperabrupt varactors as a function of applied voltage, as illustrated in FIG. 1 in accordance with embodiments of the present invention. In the testing associated with the measurements of FIG. 1, the total capacitances of 5 devices on each of 12 dies were measured from which the data shown in FIG. 1 are drawn. This measured data was used to extract area and perimeter capacitances for each device. Each die of the 12 dies had five devices and one device was selected from each die for the data shown in FIG. 1, such that the total capacitance is approximately equal to the area capacitance for the selected device in each die (i.e., the effect of the perimeter capacitance on the total capacitance is negligible for the selected device in each die). All 5 devices were located close to one another (i.e., within about 3000 microns) on the same die. The anode to cathode voltage of the varactor is swept from slightly forward bias to relatively large reverse bias but less than the onset of avalanche multiplication.

FIG. 1 shows that the nominal curve 10 fitted in accordance with Equation (2) accurately models the measured capacitances. Although the nominal curve 10 of FIG. 1, which is fitted in accordance with Equation (2), accurately models the measured capacitances, the nominal curve 10 does not account for uncertainties in the capacitance C due to process variations.

Figure 2:
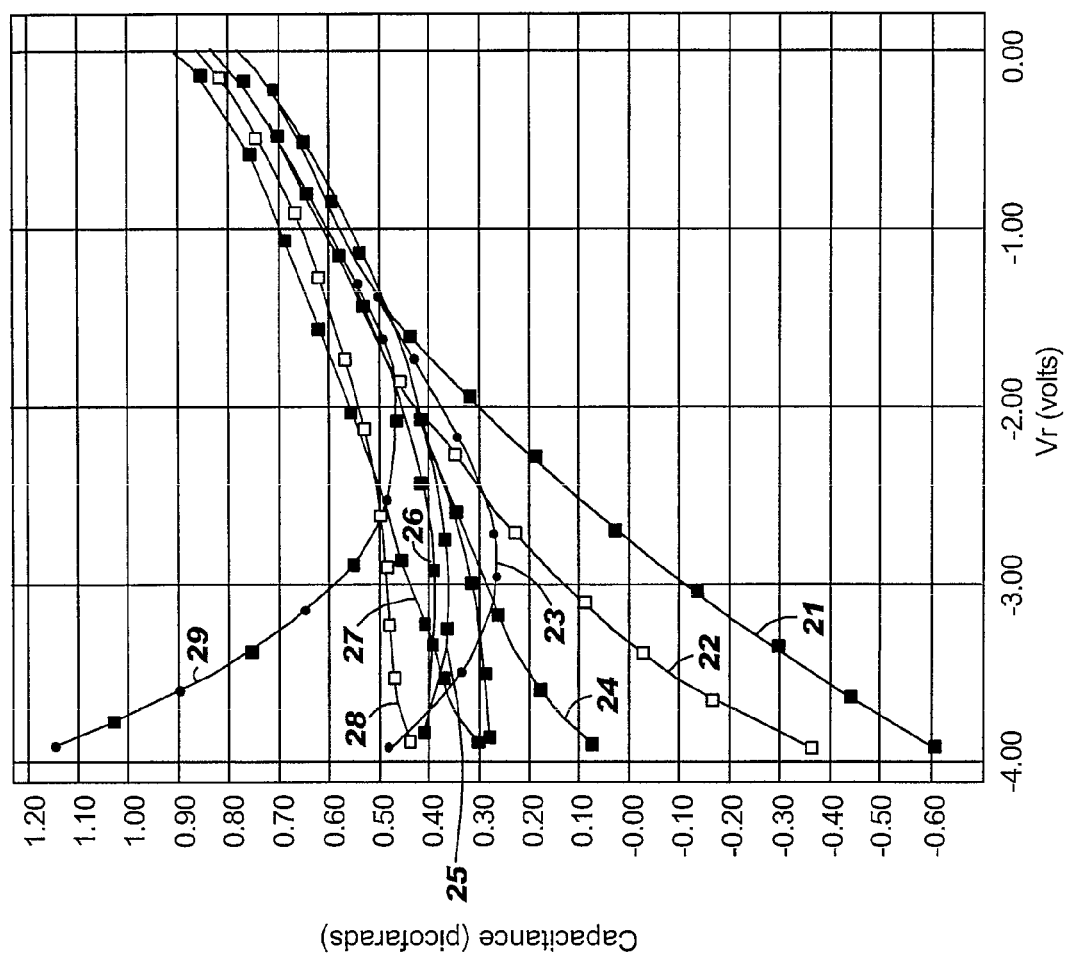
FIG. 2 depicts the effect of process variations on the nominal curve of FIG. 1 based on six independent degrees of statistical freedom, in accordance with embodiments of the present invention.

To account for the process variations, the consequent uncertainties in C may be simulated by attributing uncertainties to the parameters $C_0$, $C_1$, $C_2$, $C_3$, $C_4$, and $C_5$ of Equation (2). Accordingly, FIG. 2 illustrates capacitance versus voltage curves obtained by selecting $C_0$, $C_1$, $C_2$, $C_3$, $C_4$, and $C_5$ as being randomly distributed about a nominal fit to Equation (2) (e.g., the nominal fit 10 of FIG. 1 described supra), in accordance with embodiments of the present invention. The parameters $C_0$, $C_1$, $C_2$, $C_3$, $C_4$, and $C_5$ were randomly sampled independently and the resultant values of $C_0$, $C_1$, $C_2$, $C_3$, $C_4$, and $C_5$ were substituted into Equation 2 to generate the curves of FIG. 2. The curve 20 represents a nominal fit to Equation (2), whereas curves 21-29 were generated using sampling constraints. In particular, each coefficient of the set of coefficients (i.e., $C_0$, $C_1$, $C_2$, $C_3$, $C_4$, and $C_5$) was independently randomly selected from a normal distribution characterized by a mean equal to the nominal value of the coefficient and a standard deviation σ such that 3σ is 10% of the nominal value of the coefficient (e.g., if the nominal value is 3 then σ is 0.1). Thus, each curve of curves 21-29 has a unique set of coefficients randomly selected as described supra, such that the voltage was varied for the unique set of coefficients.

Although the nominal curve 20 in FIG. 2 is physically realistic, curves 21-29 do not accurately model the uncertainties in the capacitance C and include highly non-physical capacitances including negative capacitance values. Thus, incorporating random process variations into the model of Equation (2) by allowing random, independent variations of the parameters $C_0$, $C_1$, $C_2$, $C_3$, $C_4$, and $C_5$ does not result in a physically realistic description of the effect of random process variations on such a varactor. This non-physical result might be expected, since Equation (2) has no particular physical derivation; i.e., the polynomial form of Equation (2) was chosen for its utility in fitting the experimental curves. Nonetheless, the present invention modifies the preceding methodology in a way that generates physically realistic description of the effect of random process variations while retaining the form of Equation (2), as will be described next.

The inventors of the present invention have determined that the non-physical nature of the curves 21-29 in FIG. 2 is caused by randomly varying the parameters $C_0$, $C_1$, $C_2$, $C_3$, $C_4$, and $C_5$ independently, which is equivalent to having six degrees of statistical freedom. The six independent degrees of statistical freedom is incorrect because to have a physically realistic result there should be only one degree of statistical freedom. The basis of having only one degree of statistical freedom is supported by FIGS. 3A-3E which shows five correlating relationships among the six parameters $C_0$, $C_1$, $C_2$, $C_3$, $C_4$, and $C_5$, in accordance with embodiments of the present invention. In other words, if $C_0$ is permitted to vary randomly in conjunction with Equation (2), then the other parameters $C_1$, $C_2$, $C_3$, $C_4$, and $C_5$ are determined by being correlated with $C_0$, as shown for the area capacitance coefficients plotted in FIGS. 3A-3E.

In the tests used to infer the plotted data curves in FIGS. 3A-3E, the total capacitances of 5 devices on each of 42 dies were measured from which the area capacitance coefficients shown in FIGS. 3A-3E are drawn. This measured data was used to extract the area and perimeter capacitances. All 5 devices were located close to one another (i.e., within about 3000 microns) on the same die. All 42 dies were used to generate the area capacitance coefficient data shown in FIG. 1. Forty-two sets of polynomial coefficients were determined from these 42 die to model the area capacitance and another 42 sets of polynomial coefficients were determined from these 42 die to model the perimeter capacitance. Regression analyses of the polynomial coefficients used to model the area capacitance are shown in FIGS. 3A-3E.

FIGS. 3A-3E each show a data curve and a curve representing a quadratic fit to the data. FIG. 3A depicts $C_1$ versus $C_0$, FIG. 3B depicts $C_2$ versus $C_1$, FIG. 3C depicts $C_3$ versus $C_2$, FIG. 3D depicts $C_4$ versus $C_3$, and FIG. 3E depicts $C_5$ versus $C_4$. Thus, the correlations shown in FIGS. 3A-3E are equivalent to $C_1$, $C_2$, $C_3$, $C_4$, and $C_5$ being each correlated with $C_0$. In FIGS. 3A-3E, the fitted curves are only slightly quadratic and appear to be nearly linear in shape. Although, the curves in FIGS. 3A-3E are slightly quadratic and nearly linear, the shape of the curves of $C_1$, $C_2$, $C_3$, $C_4$, and $C_5$ versus $C_0$ may generally be linear, quadratic, or any other shape as determined empirically or by an analytical method. Thus, while the correlations in FIGS. 3A-3E are of quadratic form, any functional dependence of $C_1$, $C_2$, $C_3$, $C_4$, and $C_5$ on $C_0$ is within the scope of the present invention.

Figure 4:
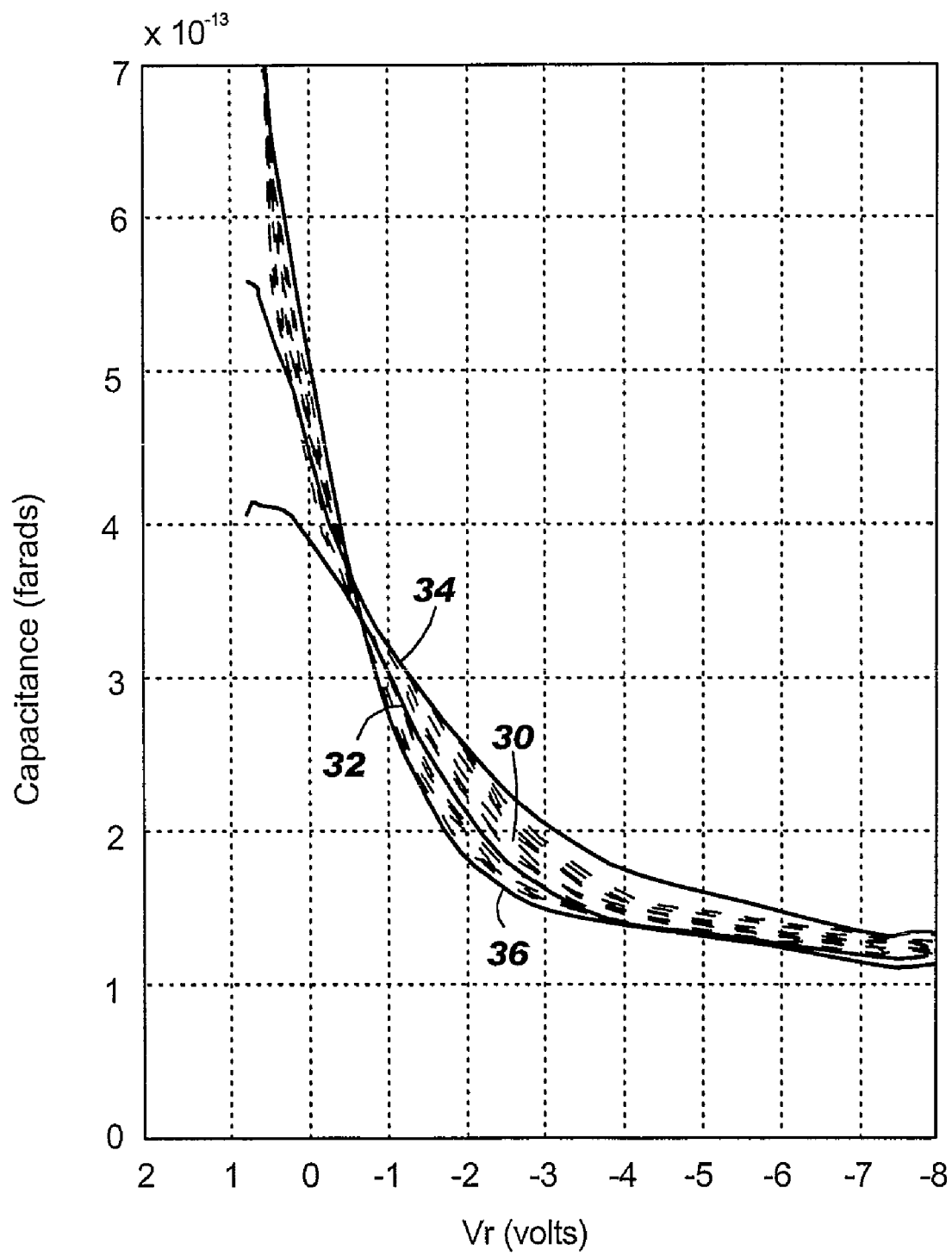
FIG. 4 depicts the effect of process variations on the nominal curve of FIG. 1 based on one independent degree of statistical freedom, in accordance with embodiments of the present invention.

Based on the curves depicted in FIGS. 3A-3E, $C_1$, $C_2$, $C_3$, $C_4$, and $C_5$ are each correlated with $C_0$ and there is thus only one degree of statistical freedom among $C_0$, $C_1$, $C_2$, $C_3$, $C_4$, and $C_5$. In using one degree of statistical freedom to simulate uncertainties such as process variations by Equation (2), the method of the present invention picks $C_0$ randomly from a probability density function (PDF) of $C_0$ and uses correlations such as shown in FIGS. 3A-3E to determine $C_1$, $C_2$, $C_3$, $C_4$, and $C_5$ from the picked value of $C_0$. A result from employing such a technique is shown in FIG. 4, which shows total capacitance versus applied voltage curves, in accordance with embodiments of the present invention. In the tests from which the curves of FIG. 4 are obtained, the total capacitances of 5 devices on each of 42 dies were measured from which the data shown in FIG. 4 are drawn. This measured data was used to extract area and perimeter capacitances. Each die of the 42 dies had five devices and one device was selected from each die for the data shown in FIG. 4. All 5 devices were located close to one another (i.e., within about 3000 microns) on the same die. The anode to cathode voltage of the varactor is swept from slightly forward bias to relatively large reverse bias but less than the onset of avalanche multiplication.

In FIG. 4, dashed lines 30 represent test data exhibiting characterized by process variations, line 32 represents a nominal fit of Equation (2) to the test data, and bounding curves 34 and 36 representing the limiting envelope of simulated process variations in conjunction with Equation (2) by picking $C_0$ randomly from its PDF and calculating $C_1$, $C_2$, $C_3$, $C_4$, and $C_5$ from the picked value of $C_0$ through the correlations analogous to those shown in FIGS. 3A-3E. FIG. 4 shows that curves 34 and 36 envelope the test data in a manner that confirms the accuracy of the method of the present invention in using Equation (2) to model the test data.

The PDF for $C_0$ may be determined as follows. Capacitance $C_0$ at zero applied voltage may be measured at a multiplicity of points on a wafer and/or on different wafers, resulting in a corresponding multiplicity of capacitances $C_0$ which reflect a variety of process variations. The measured multiplicity of capacitances may be fitted to a probability density function such, inter alia, as a normal probability distribution by any method known to a person of ordinary skill in the art (e.g., by calculating the mean of the normal distribution as the arithmetic mean of the measured capacitances, and by calculating the standard deviation of the normal distribution as the standard deviation of the measured capacitances).

Thus a method for developing a model for incorporating process variability comprises determining a PDF for $C_0$; and correlating $C_1$, $C_2$, $C_3$, $C_4$, and $C_5$ with $C_0$ as discussed supra in conjunction with FIGS. 3A-3E.

A method for using the developed model for randomly selecting a value of capacitance C comprises: providing a voltage value V=V', picking $C_0$ from its PDF; calculating $C_1$, $C_2$, $C_3$, $C_4$, and $C_5$ from their correlation with $C_0$, and substituting $C_0$, $C_1$, $C_2$, $C_3$, $C_4$, $C_5$ and V' into Equation (2) to determine C.

A method for assessing a design that includes capacitance subject to process variations comprises: evaluating a performance characteristic of the design (e.g., signal transmission speed, signal switching speed, operating temperature, power output, power conversion efficiency, the logical correctness of a logic circuit, etc.) by simulating the design. Simulating the design involves calculating capacitance at nodes (i.e., circuit locations) in the design by: providing the voltage V=V(i) at the node i, picking a value of $C_0$ from its PDF; calculating $C_1$, $C_2$, $C_3$, $C_4$, and $C_5$ from their correlation with $C_0$; and substituting $C_0$, $C_1$, $C_2$, $C_3$, $C_4$, $C_5$ and V(i) into Equation (2) to determine C. The determined values of C at the nodes are utilized to determine the performance characteristic. For example, the performance characteristic of switching speed may be a function of the values of capacitances C(1), C(2), ... so determined.

While the preceding methodology picked $C_0$ randomly, any of the other parameters $C_1$, $C_2$, $C_3$, $C_4$, and $C_5$ could have alternatively been randomly picked instead of $C_0$. For example, $C_1$ could have been picked randomly from its PDF and the other parameters $C_0$, $C_2$, $C_3$, $C_4$, and $C_5$ would be calculated from their correlations with $C_1$.

While the fifth order polynomial of Equation (2) has been utilized for implementing the method of the present invention, any equation that acceptably models or fits the characteristic (e.g., capacitance) of interest may alternatively be utilized. For examples, Equation (1) is suitable for calculating capacitance in some applications and may be utilized as follows. A probability density function (PDF) may be determined for $C_0$, and parameters $V_B$ and m by measuring correlated with $C_0$ by test measurement analogous to those obtained in conjunction with FIGS. 3A-3E, described supra. The capacitance C in Equation (1) may be randomly sampled by picking a value of $C_0$ from its PDF; calculating $V_B$ and m from their correlation with $C_0$; and substitute the picked value of $C_0$ and the calculated values of $V_B$ and m into Equation (1) to determine C.

A design that comprises capacitance may be assessed by: evaluating a performance characteristic of the design by simulating the design, which involves calculating capacitance at nodes (i.e., locations) in the design by: providing the voltage V=V(i) at node i, picking a value of $C_0$ from its PDF; calculating $V_B$ and m from their correlation with $C_0$; and substituting $V_B$ and m into Equation (1) to determine C.

In another approach, the capacitance of a physical or virtual capacitor may be expressed in terms of area capacitance $C_A$ and perimeter capacitance $C_P$ via Equation (3).

$$C = A*C_A + P*C_P \quad (3)$$

wherein A is the plate area and P is the plate perimeter of the capacitor, wherein A and P are assumed to be known at each location (e.g., in the wafer) where C is to be calculated, $C_A$ and $C_P$ may each be modeled by Equation (2) or any other applicable fit equation (e.g, Equation (1) in some applications); i.e., $$C_A = C_{0A}(1 + C_{1A}V + C_{2A}V^2 + C_{3A}V^3 + C_{4A}V^4 + C_{5A}V^5) \quad (4)$$

$$C_P = C_{0P}(1 + C_{1P}V + C_{2P}V^2 + C_{3P}V^3 + C_{4P}V^4 + C_{5P}V^5) \quad (5)$$

An algorithm of the present invention: determines $C_A$ and $C_P$ by random sampling; and substituting $C_A$ and $C_P$ into Equation (3) to obtain C. $C_A$ and $C_P$ may be calculated independently or correlatively, depending on whether $C_{0A}$ and $C_{0P}$ are sufficiently correlated. A correlation between $C_{0A}$ and $C_{0P}$ may be deduced from scatter data of $C_{0A}$ as a function of $C_{0P}$, wherein the points of the scatter data may represent pairs of ($C_{0A}$, $C_{0P}$) at a variety of locations on a wafer and/or several wafers. For a given applied voltage V, each pair of ($C_A$, $C_P$) may be deduced from Equation (3), by measuring C for at least two sufficiently close locations on the wafer (e.g., on a kerf surrounding a semiconductor chip) at which $C_A$ and $C_P$ are not expected to vary due to process variation. Therefore at zero applied voltage V, each pair of ($C_{0A}$, $C_{0P}$) may be deduced from Equation (3) by measuring C (at zero volts) for least two sufficiently close locations on the wafer at which $C_{0A}$ and $C_{0P}$ are not expected to vary due to process variation. Thus, ($C_A$, $C_P$) and ($C_{0A}$, $C_{0P}$) may generally be inferred from measurement of total capacitance C for at least two sufficiently close locations on the wafer, at a given non-zero applied voltage V and a given zero applied voltage V, respectively.

A correlation coefficient r (e.g., a Pearson correlation coefficient) may be calculated from the scatter data of $C_{0A}$ versus $C_{OP}$. Although the scatter data may be represented graphically in the form of a scatter plot, an actual scatter plot is not required for calculation the correlation coefficient r, since the correlation coefficient r may be calculated directly from the scatter data itself. Since the correlation coefficient r is generally in a range of −1 to 1, it is useful to define a correlation parameter $R=r^2$, which falls in the range of 0 to 1. $C_{OA}$ and $C_{OP}$ may be considered as being sufficiently correlated if the correlation parameter R is no less than a specified value $R_{MIN}$ (e.g., $R_{MIN}$ may be in a range of, inter alia, 0.70-0.90). If $C_{OA}$ and $C_{OP}$ are sufficiently correlated, then $C_{OA}$ may be regressed upon $C_{OP}$ to determine an equation that correlates $C_{OA}$ with $C_{OP}$. Thus if $C_{OA}$ and $C_{OP}$ are sufficiently correlated, then $C_{OP}$ may be picked randomly from its PDF and $C_{OA}$ may then be calculated from the equation that correlates $C_{OA}$ with $C_{OP}$. Alternatively, $C_{OA}$ may be picked randomly from its PDF and $C_{OP}$ may then be calculated from the equation that correlates $C_{OP}$ with $C_{OA}$ which is the inverse of the equation that correlates $C_{OA}$ with $C_{OP}$. However, if $C_{OA}$ and $C_{OP}$ are not sufficiently correlated, then $C_{OA}$ and $C_{OP}$ may be independently picked randomly from their respective PDFs.

The coefficients $C_{1A}$, $C_{2A}$, $C_{3A}$, $C_{4A}$, $C_{5A}$ of Equation (4) are each correlated with $C_{0A}$ in a manner analogous to the correlation of $C_1$, $C_2$, $C_3$, $C_4$, and $C_5$ with $C_0$ as described supra in conjunction with FIGS. 3A-3E. Similarly, the coefficients $C_{1P}$, $C_{2P}$, $C_{3P}$, $C_{4P}$, $C_{5P}$ of Equation (5) are each correlated with $C_{0P}$ in a manner analogous to the correlation of $C_1$, $C_2$, $C_3$, $C_4$, and $C_5$ with $C_0$ as described supra in conjunction with FIGS. 3A-3E. After values of $C_{0A}$ and $C_{0P}$ are determined as described supra, the remaining sets of coefficients ($C_{1A}$, $C_{2A}$, $C_{3A}$, $C_{4A}$, $C_{5A}$) and ($C_{1P}$, $C_{2P}$, $C_{3P}$, $C_{4P}$, $C_{5P}$) are determined from their correlation with $C_{0A}$ and $C_{0P}$, respectively. Then $C_A$ and $C_P$ may be calculated from Equations (4) and (5), respectively, which enables C to be subsequently determined by substituting $C_A$ and $C_P$ into Equation (3). The determined values of C at the locations in the design are then utilized to determine the performance characteristic. For example, the performance characteristic of switching speed may be a function of the values of capacitance C so determined.

The preceding discussion of FIGS. 1-4 and Equations 1-5 for the example of the capacitance of a varactor will next be extended in the second and third segments of the description herein to formulate the scope of the present invention in its generality. The second segment of the description herein formulates the present invention generally by discussing the modeling of a characteristic C that is distributed within a domain, wherein C is not expressed in terms of any subcharacteristics of C. The third segment of the description herein formulates the present invention generally by discussing the modeling of a characteristic C that is distributed within a domain, wherein C is expressed in terms of a plurality of subcharacteristics of C.

Modeling a Characteristic Not Expressed in Terms of Subcharacteristics

The present invention discloses a method for statistically modeling a characteristic C that is distributed within a domain, wherein C is a function of a variable V, and wherein C is not expressed in terms of subcharacteristics, as embodied in the example of Equation (2) discussed supra. The domain may be a physical domain (e.g., a physical surface or volume) such as, inter alia, a semiconductor wafer comprising integrated circuits, a geographic neighborhood comprising houses, a galaxy comprising stars, etc. For the example of a semiconductor wafer comprising integrated circuits, the characteristic C may be capacitance and the variable V may be applied voltage, as discussed supra in conjunction with Equation (2). The domain may also be a non-physical domain such as, inter alia, the domain of stocks on the New York Stock Exchange, wherein the characteristic C may be, inter alia, the price-to-earnings (PE) ratio of each stock and the variable V may be, inter alia, an interest rate benchmark (e.g., the Federal Funds interest rate).

Figure 5:
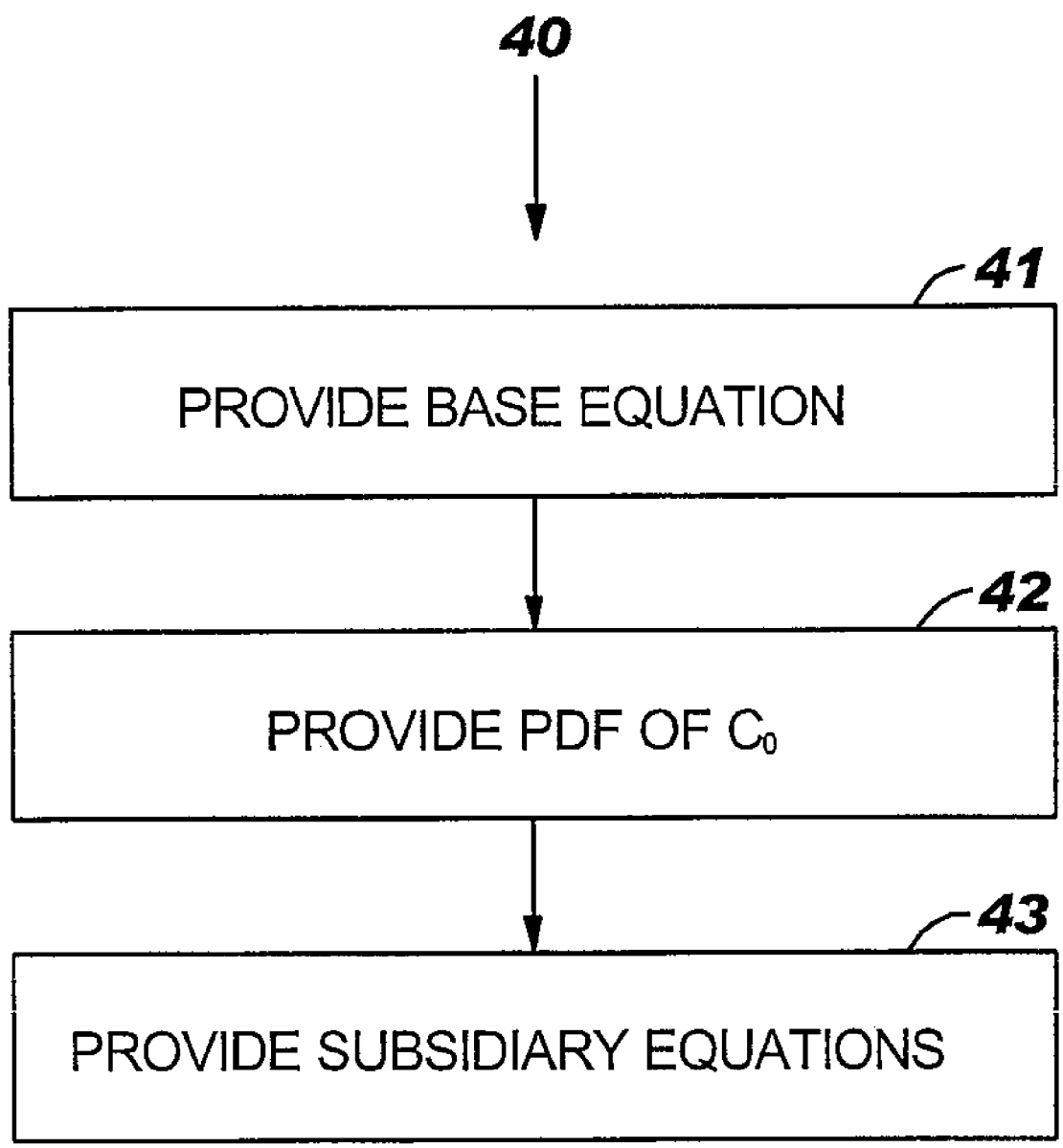
FIG. 5 is a flow chart for providing a model for a characteristic C distributed in a domain wherein the characteristic C is not expressed in terms of subcharacteristics of C, in accordance with embodiments of the present invention.
Figure 6:
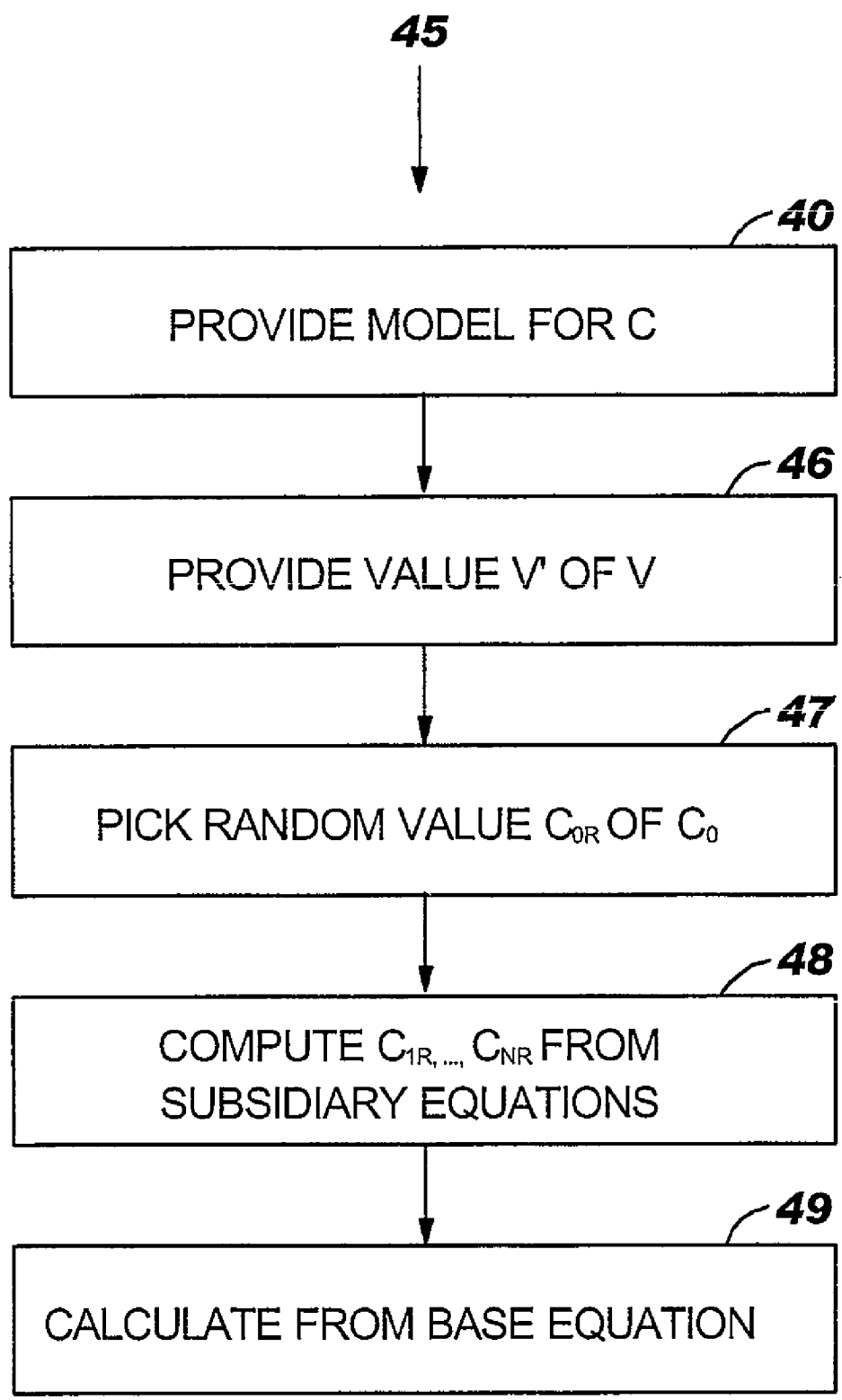
FIG. 6 is a flow chart for randomly sampling C based on the model provided in FIG. 5, in accordance with embodiments of the present invention.
Figure 7:
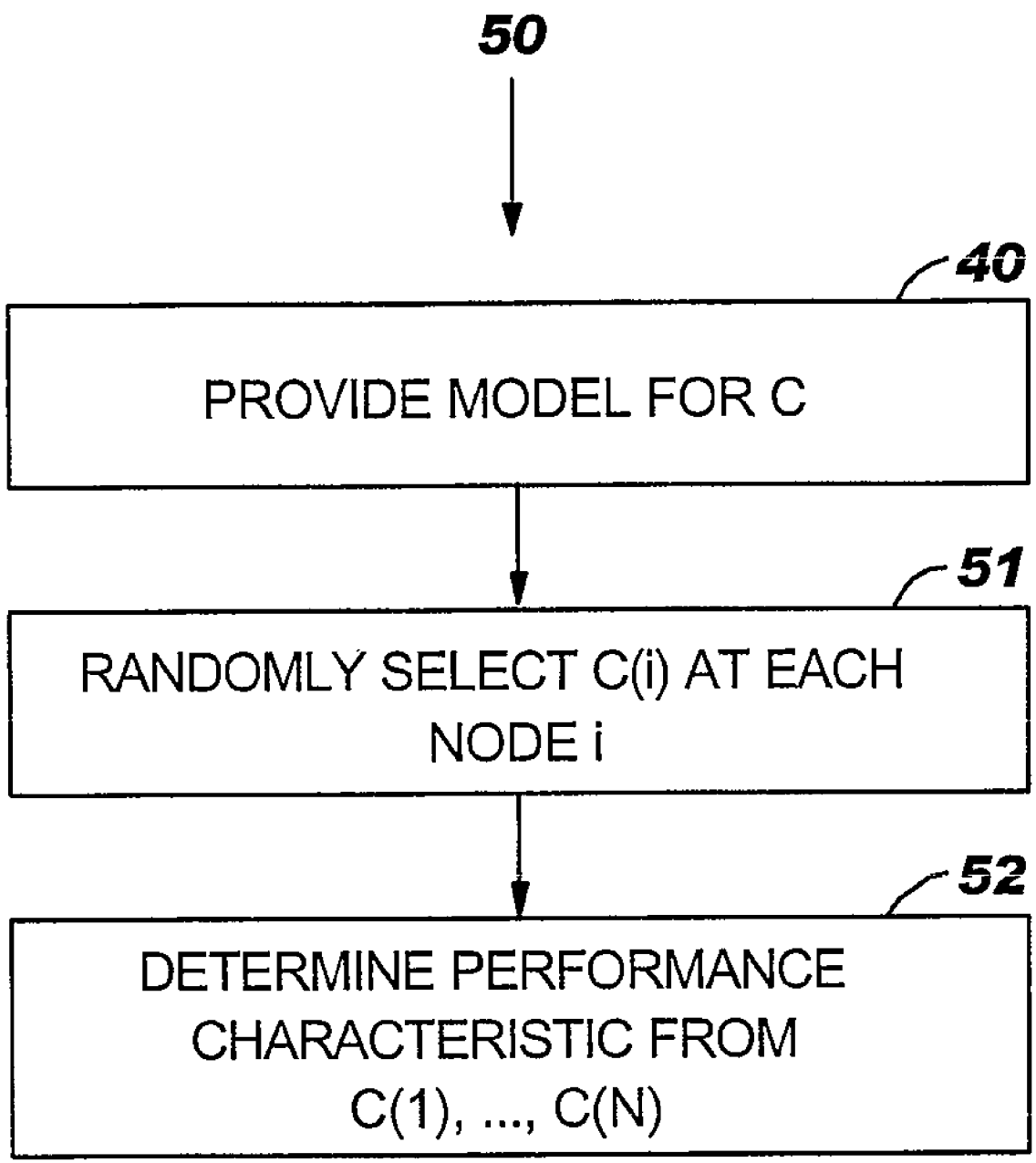
FIG. 7 is a flow chart for determining a performance parameter of a design based on the model of C in FIG. 5 and on the method for sampling C in FIG. 6, in accordance with embodiments of the present invention.

The method is next described in conjunction with FIGS. 5-7, in accordance with embodiments of the present invention. FIG. 5 is a flow chart for providing a model for representing the characteristic C. FIG. 6 is a flow chart for randomly sampling C based on the model for C described by FIG. 5. FIG. 7 is a flow chart for determining a performance characteristic of a design, based on the model of C in FIG. 5 and the method for randomly sampling C in FIG. 6.

FIG. 5 is a flow chart 40 depicting steps 41-43 which describe providing a model for C. Step 41 provides a base equation for modeling C. The base equation expresses the characteristic C as a function f of the variable V through use of N+1 parameters $C_0, C_1, \ldots, C_N$. The base equation is of the form:

$$C = f(C_0, C_1, \ldots, C_N, V) \tag{6}$$

wherein N is at least 1 and parameters $C_0, C_1, \ldots, C_N$ are subject to uncertainty. A specific example of the base equation (6) is Equation (2) wherein N=5. Another example of the base equation (6) is Equation (1) wherein N=2 (i.e., $C_1=V_B$ and $C_2=m$).

Step 42 provides a probability density function (PDF) for describing the probability of occurrence of $C_0$ in accordance with the uncertainty in $C_0$. The PDF may be a normal probability distribution or any other form of probability distribution, The discussion supra provided an explanation of how the PDF of $C_0$ relating to the capacitance of Equation (2) may be determined from an analysis of test data. This methodology for providing the PDF of $C_0$ from test data may be formulated by postulating that the domain comprises nodes such that test data is obtained at the nodes. For the capacitance example discussed supra, the nodes may each correspond to an integrated circuit on a wafer.

To determine the PDF of $C_0$ from testing, test data of $C=C_0(k)$ may be obtained at each node k of K nodes (K at least 2) such that $V=V_0$ at node k, wherein $V_0=0$ volts in the capacitance example discussed supra, wherein $C_0(k)$ is defined as being $C_0$ at node k, and wherein k has values of 1, 2, ..., K. The PDF of $C_0$ is derived from the aforementioned test data as described supra; i.e., by any method known to a person of ordinary skill in the art of fitting a functional form of a PDF to test data.

The discussion supra provides an explanation of how the PDF of $C_0$ may be determined from an analysis of test data. However, the scope of the present invention includes determining the PDF of $C_0$ not only from test data, but alternatively by any other method such as from an analytical calculation or from computer simulation based on an assumed analytical model.

Step 43 provides subsidiary equations expressing $C_1, \ldots, C_N$ in terms of $C_0$. An example of subsidiary equations are equations representing the dependencies depicted in FIGS. 3A-3E, discussed supra, which have the general form of: $C_x = g_x(C_{x-1})$ for functions $g_x$ such that x has values of 1, 2, ..., N. Although in FIGS. 3A-3E specifically, $C_x$ is a linear of quadratic function $g_x$ of $C_{x-1}$, the parameter $C_x$ may generally be any function $g_x$ of $C_{x-1}$ which accurately represents the functional relationship between $C_x$ and $C_{x-1}$. Note that the equations $C_x=g_x(C_{x-1})$ may be transformed into the equivalent form: $C_x=h_x(C_0)$ for x=1, 2, ..., N.

To determine the subsidiary equations from testing, test data of C(k) versus V may be obtained at each node k of K nodes, wherein K is at least 2, wherein a 'node' is a different location in the region of testable devices (e.g., test sites on a wafer), wherein C(k) is defined as C at node k, and wherein k has values of 1, 2, ..., K. The function f in Equation (6) is fitted to the test data at each node k to obtain $C(k)=f(C_0(k), C_1(k), \ldots, C_N(k), V)$, wherein $C_0(k), C_1(k), \ldots, C_N(k)$ respectively denote $C_0, C_1, \ldots, C_N$ at node k. The subsidiary equations are subsequently derived by utilizing $C(k)=f(C_0(k), C_1(k), \ldots, C_N(k), V)$ at each node k of the K nodes. For example, a curve of a given analytical form (e.g., linear, quadratic, exponential, etc.) for representing $C_1$ versus $C_0$ can be fitted to the K points $(C_0(1), C_1(1)), (C_0(2), C_1(2)), \ldots, (C_0(K), C_1(K)), \ldots$ FIG. 6 is a flow chart 45 depicting steps 40 and 46-49 for randomly sampling C. Step 40 is the flow chart 40 of FIG. 5 which provides the model for C, described supra. Given the model for C provided by step 40, steps 46-49 are executed when a value of C is to be randomly sampled.

Step 46 provides a value V' of V as input to the process of randomly sampling C.

Step 47 picks a random value $C_{OR}$ of $C_0$ from the PDF of $C_0$, wherein the PDF was provided in step 42 of FIG. 5 as described supra. Given a PDF of $C_0$, any method for picking $C_{OR}$ from the PDF may be utilized (e.g., picking $C_{OR}$ by utilizing the cumulative probability distribution associated with the PDF as is known in the art).

Step 48 computes values $C_{1R}, \ldots, C_{NR}$ of $C_1, \ldots, C_N$, respectively, by substituting $C_{OR}$ into the subsidiary equations that were provided in step 43 of FIG. 5, described supra.

Step 49 calculates C by substituting $C_{OR}, C_{1R}, \ldots, C_{NR}$ and V' into the base equation provided in step 41 of FIG. 5.

FIG. 7 is a flow chart 50 depicting steps 40 and 51-52 for determining a performance characteristic of a design, based on the model of C in FIG. 5 and the method for randomly sampling C in FIG. 6. The design comprises I nodes in the domain in which C is distributed, wherein I is at least 2. Each node i of the I nodes has a value C(i) of the characteristic C, wherein i has values of 1, 2, ..., I. Step 40 is the flow chart 40 of FIG. 5 which provides the model for C, described supra.

Given the model for C provided by step 40, step 51 randomly selects a value of C(i) of C at each node i of the I nodes. At each node i, step 51 is implemented by executing steps 46-49 of FIG. 6, wherein V' in step 46 is V(i). V(i) is defined as the value of V at node i, which is input to the calculation of C(i) as discussed supra in conjunction with step 46 of FIG. 6.

Given the values of C(1), C(2), ..., C(I) randomly selected in step 51, step 52 determines the performance characteristic, by utilizing the randomly selected values of C(1), C(2), ..., C(I).

Modeling a Characteristic Expressed in Terms of Subcharacteristics

The present invention discloses a method for statistically modeling a characteristic C that is distributed within a domain, wherein C is a function of a variable V, and wherein C is expressed in terms of J subcharacteristics $S_1, S_2, \ldots, S_J$, as embodied in the example of Equation (3) discussed supra. The domain may be a physical domain (e.g., a physical surface or volume) such as, inter alia, a semiconductor wafer comprising integrated circuits, a geographic neighborhood comprising houses, a galaxy comprising stars, etc. For the example of a semiconductor wafer comprising integrated circuits, the characteristic C may be capacitance, the subcharacteristics of C may be area capacitance $C_A$ and perimeter capacitance $C_P$ (i.e., J=2), and the variable V may be applied voltage, as discussed supra in conjunction with Equation (3). The domain may also be a non-physical domain such as, inter alia, the domain of stocks on the New York Stock Exchange, wherein the characteristic C may be, inter alia, the price-to-earnings (PE) ratio of each stock, the subcharacteristics may be stocks paying dividends and stocks not paying dividends (i.e., J=2), and the variable V may be, inter alia, an interest rate benchmark (e.g., the Federal Funds interest rate).

Figure 8:
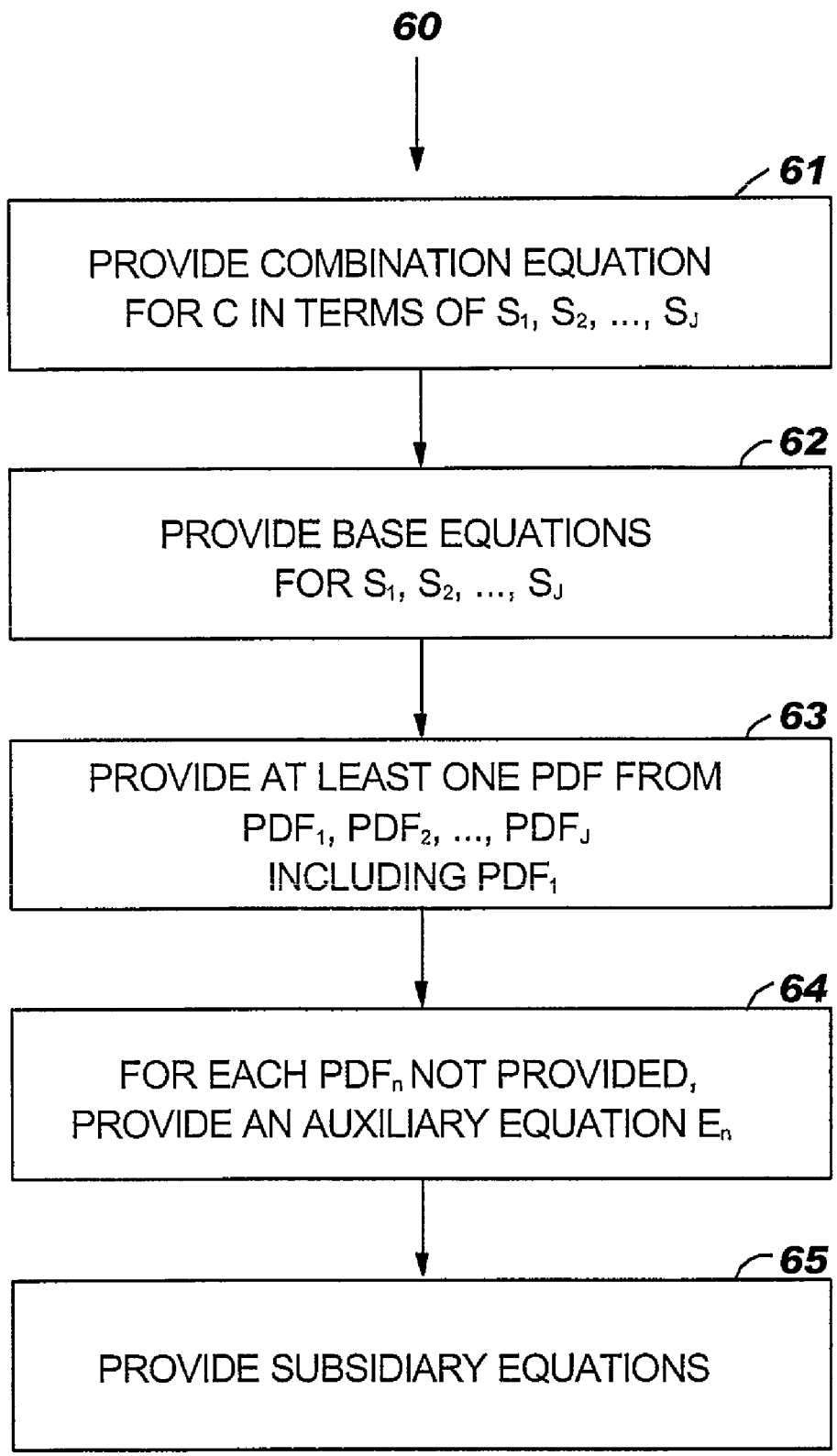
FIG. 8 is a flow chart for providing a model for a characteristic C distributed in a domain wherein the characteristic C is expressed in terms of subcharacteristics of C, in accordance with embodiments of the present invention.
Figure 9:
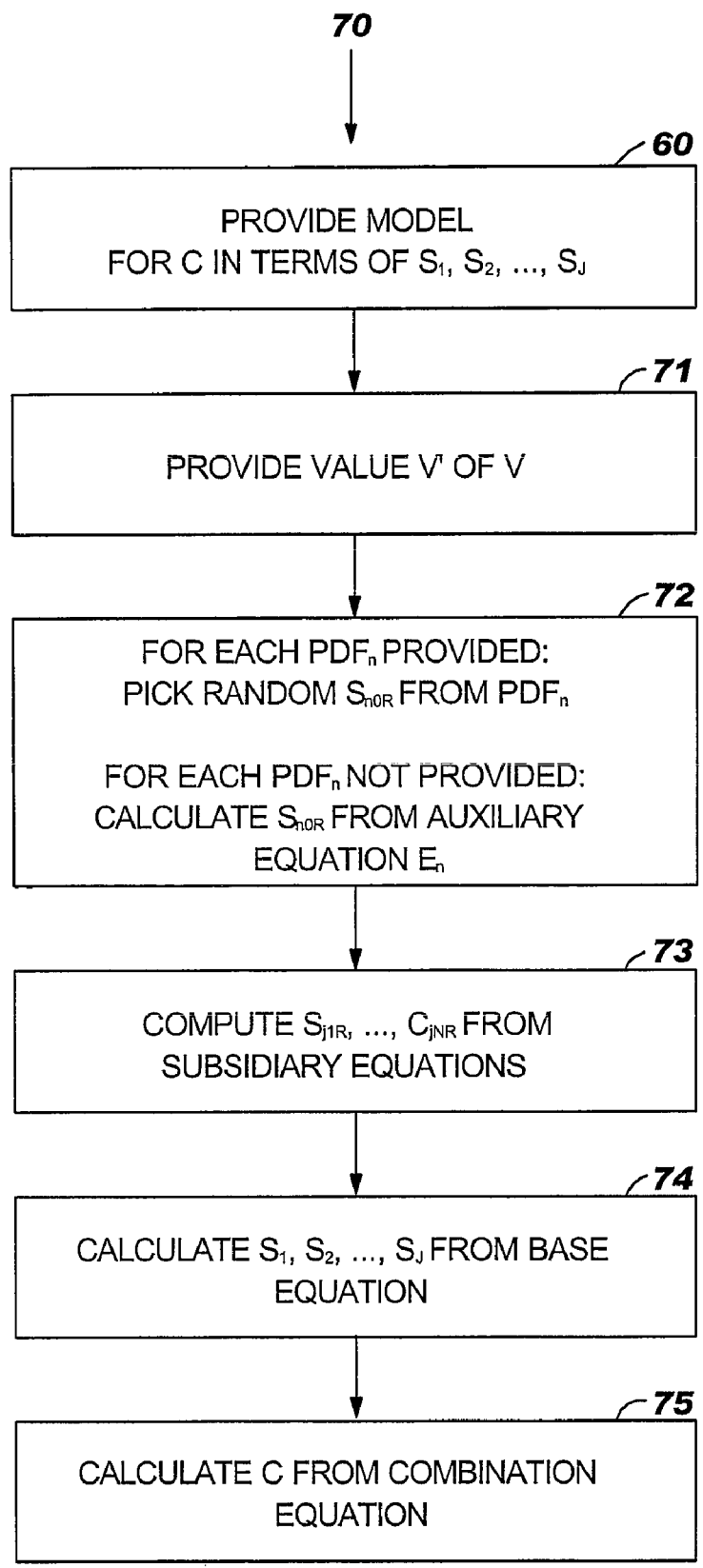
FIG. 9 is a flow chart for randomly sampling C based on the model provided in FIG. 8, in accordance with embodiments of the present invention.
Figure 10:
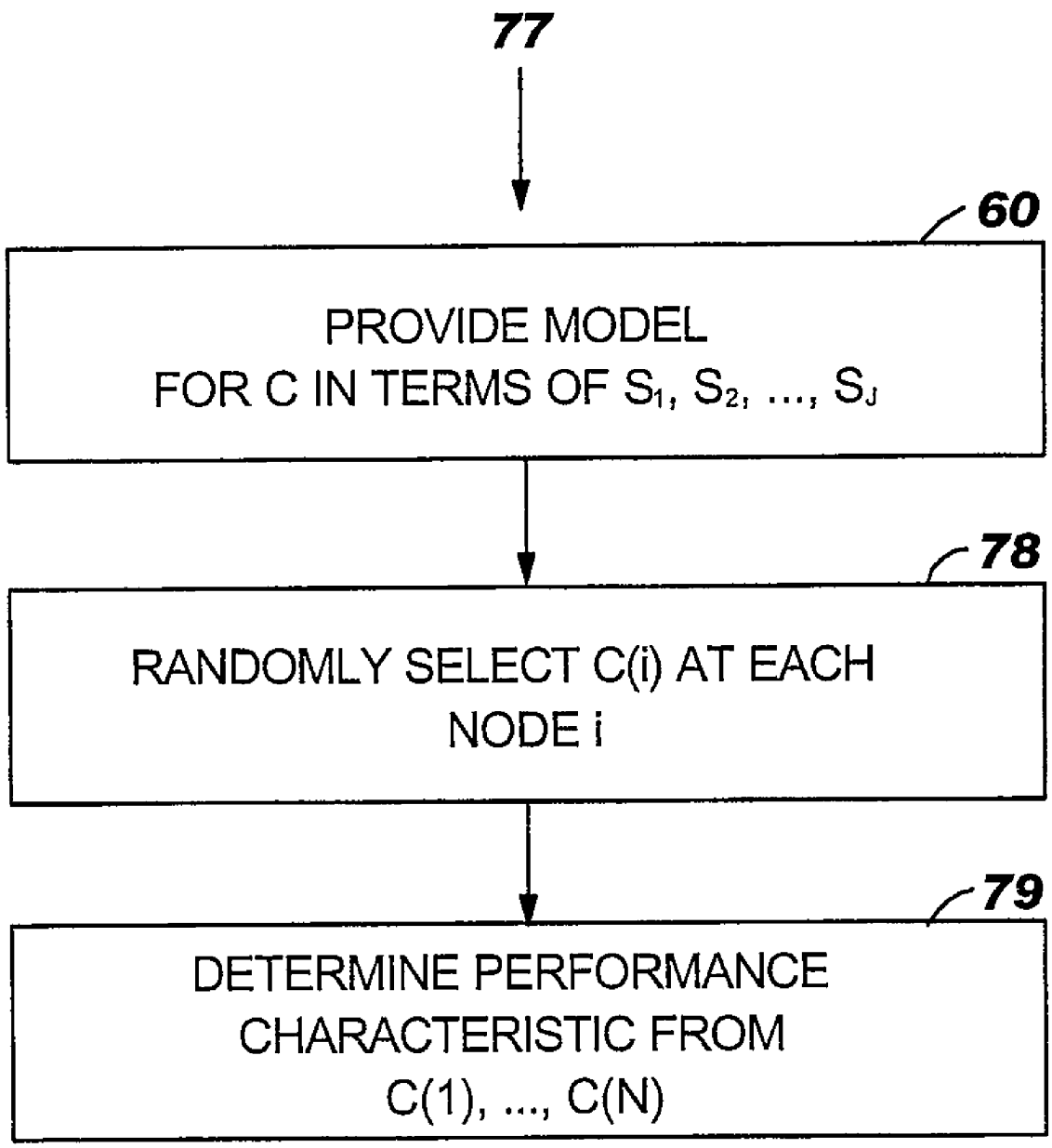
FIG. 10 is a flow chart for determining a performance parameter of a design based on the model of C in FIG. 8 and on the method for sampling C in FIG. 9, in accordance with embodiments of the present invention.

The method is next described in conjunction with FIGS. 8-10, in accordance with embodiments of the present invention. FIG. 8 is a flow chart for providing a model for representing the characteristic C in terms of its J subcharacteristics $S_1, S_2, \ldots, S_J$. FIG. 9 is a flow chart for randomly sampling C based on the model for C and its subcharacteristics described by FIG. 8. FIG. 10 is a flow chart for determining a performance characteristic of a design, based on the model of C and its subcharacteristics in FIG. 8 and the method for randomly sampling C in FIG. 9.

FIG. 8 is a flow chart 60 depicting steps 61-65 which describe providing a model for C. Step 61 provides a combination equation for modeling C as a function F its J subcharacteristics $S_1, S_2, \ldots, S_J$. The combination equation is of the general form:

$$C=F(S_1, S_2, \ldots, S_J) \quad (7)$$

as illustrated by the example of Equation (3) in which C is a linear combination of $C_A$ and $C_P$ (i.e., J=2, $S_1=C_A$, $S_2=C_P$).

Step 62 provides base equations which express $S_j$ as a function $f_j$ of a variable V through use of N+1 parameters $S_{j0}, S_{j1}, \ldots, S_{jN}$. The base equations are of the form:

$$S_j=f_j(S_{j0}, S_{j1}, \ldots, S_{jN}, V) \quad (8)$$

wherein N is at least 1. The parameters $S_{j0}, S_{j1}, \ldots, S_{jN}$ are subject to uncertainty, and the subscript j has values of 1, 2, ..., J. For a fixed value of j, the parameters $S_{j0}, S_{j1}, \ldots, S_{jN}$ in base equations (8) are analogous to parameters $C_0, C_1, \ldots, C_N$ in Equation (6).

In Equation (8), $f_j$ may have various functional characteristics. A first example of a functional characteristic for $f_j$ is that $f_j$ may have a same functional form of V for each subcharacteristic $S_j$ of the J subcharacteristics (e.g., a fifth order polynomial in V for each $S_j$). A second example of a functional characteristic for $f_j$ is that $f_j$ may be constant with respect to any variation in V for each subcharacteristic $S_j$ of the J subcharacteristics (i.e., $f_j$ does not depend on V). A third example of a functional characteristic for $f_j$ is that $f_j$ may vary with respect to a variation in V for each subcharacteristic $S_j$ of the J subcharacteristics (i.e., each $f_j$ varies with V).

Step 63 provides at least one probability density function (PDF) selected from $PDF_1, PDF_2, \ldots, PDF_J$. $PDF_n$ describes the probability of occurrence of $S_{n0}$ for n=1, 2, ..., J. $PDF_1, PDF_2, \ldots, PDF_J$ may each be a normal probability distribution or any other form of probability distribution. At least one $PDF_n$ is provided and $PDF_1$ is always provided. Thus for n>0, none, some, or all of the $PDF_n$ may be provided. If provided, $PDF_n$ may be determined by any method described supra for determining the PDF of $C_0$, including test methods, analytical calculation, or computer simulation based on an assumed analytical model.

As stated supra, $PDF_1$ is always provided. $PDF_n$ (for n>0) is not provided if $S_{n0}$ is sufficiently correlated with $S_{10}$. $S_{n0}$ is sufficiently correlated with $S_{10}$ if a correlation parameter $R_n$ between $S_{n0}$ and $S_{10}$ is no less than a specified minimum correlation parameter $R_{MIN}$. The correlation parameter $R_n$ is the square of a correlation coefficient $r_n$ between $S_{n0}$ and $S_{10}$. The correlation coefficient $r_n$ may be determined from scatter data of $S_{n0}$ versus $S_{10}$ as described supra.

For each $PDF_n$ not provided, step 64 provides an auxiliary equation $E_n$ expressing $S_{n0}$ in terms of $S_{10}$, which is analogous to the aforementioned relating of $C_{OA}$ to $C_{OP}$ to determine an equation correlating $C_{OA}$ with $C_{OP}$, as discussed supra. The auxiliary equation $E_n$ may be derived from the scatter data of $S_{n0}$ versus $S_{10}$.

Step 65 provides subsidiary equations expressing $S_{j1}, \ldots, S_{jN}$ in terms of $S_{j0}$ for each subcharacteristic $S_j$ of the J subcharacteristics, which for a fixed j are analogous to the subsidiary equations expressing $C_1, \ldots, C_N$ in terms of $C_0$ as described supra in conjunction with FIGS. 3A-3E. Thus the subsidiary equations for calculating $S_{j1}, \ldots, S_{jN}$ in terms of $S_{j0}$ (for fixed j) may be derived by any of the methods described supra for deriving the subsidiary equations for calculating $C_1, \ldots, C_N$ in terms of $C_0$.

FIG. 9 is a flow chart 70 depicting steps 60 and 71-75 for randomly sampling C. Step 60 is the flow chart 60 of FIG. 8 which provides the model for C in terms of its J subcharacteristics $S_1, S_2, \ldots, S_J$, described supra. Given the model for C provided by step 60, steps 71-75 are executed when a value of C is to be randomly sampled.

Step 71 provides a value V' of V as input to the process of randomly sampling C.

For each $PDF_n$ provided in step 63 of FIG. 8 (including $PDF_1$), step 72 picks a random value of $S_{n0R}$ from $PDF_n$. For each $PDF_n$ not so provided, step 72 calculates $S_{n0R}$ by substituting $S_{10R}$ into the auxiliary equation $E_n$ provided in step 64 of FIG. 8.

Step 73 computes values $S_{j1R}, \ldots, S_{jNR}$ of $S_{j1}, \ldots, S_{jN}$, respectively, by substituting $S_{j0R}$ into the subsidiary equations provided by step 65 of FIG. 8 for each subcharacteristic $S_j$ of the J subcharacteristics.

Step 74 calculates $S_j$ by substituting $S_{j0R}, S_{j1R}, \ldots, S_{jNR}$ and V' into the base equations provided by step 62 of FIG. 8 for each subcharacteristic $S_j$ of the J subcharacteristics Step 75 calculates C by substituting $S_1, S_2, \ldots, S_J$ into the combination equation provided by step 61 of FIG. 8.

FIG. 10 is a flow chart 77 depicting steps 60 and 78-79 for determining a performance characteristic of a design, based on the model of C in FIG. 8 and the method for randomly sampling C in FIG. 9. The design comprises I nodes in the domain in which C is distributed, wherein I is at least 2. Each node i of the I nodes has a value C(i) of the characteristic C, wherein i has values of $1, 2, \ldots, I$. Step 60 is the flow chart 60 of FIG. 8 which provides the model for C in terms of its J subcharacteristics $S_1, S_2, \ldots, S_J$, described supra.

Given the model for C in terms of its J subcharacteristics $S_1, S_2, \ldots, S_J$ provided by step 60, step 78 randomly selects a value of C(i) of C at each node i of the I nodes. At each node i, step 78 is implemented by executing steps 71-75 of FIG. 9, wherein V' in step 71 is V(i). V(i) is defined as the value of V at node i, which is input to the calculation of C(i) as discussed supra in conjunction with step 71 of FIG. 9.

Given the values of $C(1), C(2), \ldots, C(I)$ randomly selected in step 78, step 79 determines the performance characteristic, by utilizing the randomly selected values of $C(1), C(2), \ldots, C(I)$.

While the description of embodiments of the present invention has focused on modeling a characteristic C or subcharacteristic $S_j$ that depends on a single independent variable V, the scope of the present invention also includes modeling C and $S_j$ each as a function of a plurality of independent variables $V_1, V_2, \ldots$, wherein the base Equations (6) and (8) for C and $S_j$ would be respectively generalized to Equations (9) and (10):

$$C = f(C_0, C_1, \ldots, C_N, V_1, V_2, \ldots) \quad (9)$$

$$S_j = f_j(S_{j0}, S_{j1}, \ldots, S_{jN}, V_1, V_2, \ldots) \quad (10)$$

The dependence of C and/or $S_j$ on $V_1, V_2, \ldots$ may be individually tailored for each of $V_1, V_2, \ldots$ and may be cast in any applicable functional form for each independent variable such as, inter alia, the polynomial functional form of Equation (2) and/or Equations (4)-(5). The parameters $C_0, C_1, \ldots C_N$ would be coupled to the variables $V_1, V_2, \ldots$ in a manner that reflects the functional forms chosen. For example for the case of fitting C to a polynomial in each independent variable of two independent variables $V_1$ and $V_2$, some of the parameters of $C_0, C_1, \ldots$ may appear as coefficients of powers of $V_1$ whereas other parameters of $C_0, C_1, \ldots$ may appear as coefficients of powers of $V_2$. Similar to the single independent variable V embodiment when picking a random value of C, the parameter $C_0$ for the multiple independent variable $V_1, V_2, \ldots$ embodiment would be picked from its PDF and parameters $C_1, \ldots, C_N$ would be determined based on their relationship to $C_0$ as expressed in subsidiary equations in accordance with the description supra thereof.

Computer System

Figure 11:
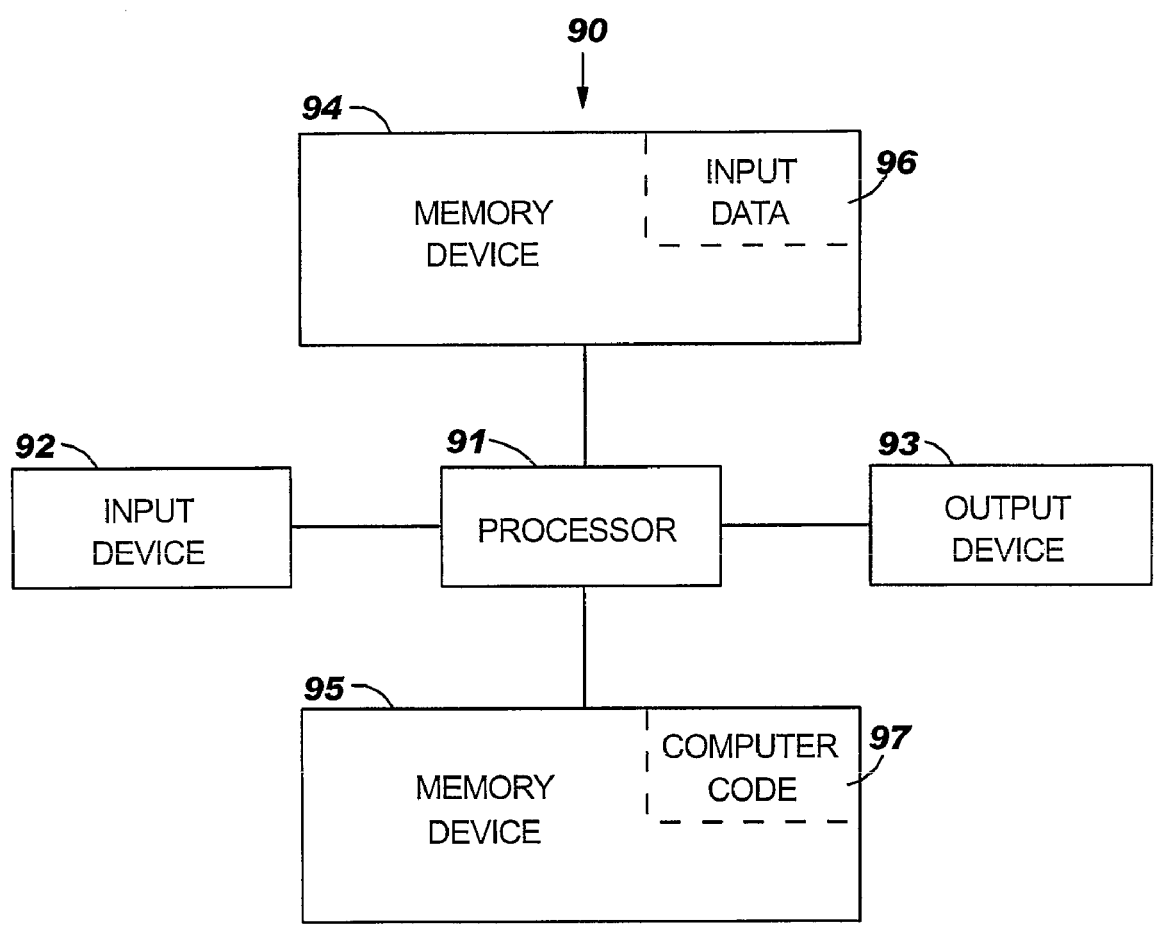
FIG. 11 illustrates a computer system used for implementing one or more algorithms that model a characteristic of a design, in accordance with embodiments of the present invention.

FIG. 11 illustrates a computer system 90 used for implementing algorithms that model and sample a characteristic C (and assess a design comprising C), in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes one or more algorithms that model and sample the characteristic C (and assess a design comprising C), in accordance with embodiments of the present invention. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 11) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 11 shows the computer system 90 as a particular configuration of hardware and software, any configuration of hardware and software, as would be known to a person of ordinary skill in the art, may be utilized for the purposes stated supra in conjunction with the particular computer system 90 of FIG. 11. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for modeling a characteristic C that is distributed within a domain, said characteristic C having J subcharacteristics $S_1, S_2, \ldots, S_J$, said method comprising:

storing a combination equation in at least one computer-readable memory device, said base equation expressing C as a function F of the J subcharacteristics, said J being at least 2;

storing base equations in the at least one computer-readable memory device, said base equations expressing $S_j$ as a function $f_j$ of a variable V through use of N+1 parameters $S_{j0}, S_{j1}, \ldots, S_{jN}$, said base equations being of a form $S_j = f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

generating at least one probability density function (PDF) from $PDF_1, PDF_2, \ldots, PDF_J$, said $PDF_n$ describing a probability of occurrence of $S_{n0}$ in accordance with said uncertainty for $n=1, 2, \ldots, J$, said at least one PDF including $PDF_1$;

for each $PDF_n$ not generated, generating an auxiliary equation $E_n$ expressing $S_{n0}$ in terms of $S_{10}$;

generating subsidiary equations expressing $S_{j1}, \ldots, S_{jN}$ in terms of $S_{j0}$ for each subcharacteristic $S_j$ of the J subcharacteristics; and storing the at least one PDF, the auxiliary equations, and the subsidiary equations in the at least one computer-readable memory device, wherein the combination equation, the base equations, the at least one PDF, the auxiliary equations, and the subsidiary equations are adapted to be accessed from the at least one memory device for usage in determining C.

2. The method of claim 1, wherein $S_j = S_{j0}$ if $V=V_0$ for each subcharacteristic $S_j$ of the J subcharacteristics, and wherein generating the $PDF_n$ for the at least one n comprises:

providing test data from which $S_{n0}(k)$ may be inferred at each node k of K nodes in a space such that $V=V_0$ at node k, said $S_{n0}(k)$ being $S_{n0}$ at node k, said K being at least 2, said k having values of $1, 2, \ldots, K$; and generating said $PDF_n$ from said test data.

3. The method of claim 1, wherein generating the subsidiary equations comprises for each subcharacteristic $S_j$ of the J subcharacteristics:

providing test data from which $S_j(k)$ versus V may be inferred at each node k of K nodes in a space, said $S_j(k)$ being $S_j$ at node k, said K being at least 2, said k having values of $1, 2, \ldots, K$;

fitting the function $f_j$ to the test data at each node k of the K nodes to obtain $S_j(k) = f(S_{j0}(k), S_{j1}(k), \ldots, S_{jN}(k), V)$, said $S_{j0}(k), S_{j1}(k), \ldots, S_{jN}(k)$ respectively denoting $S_{j0}, S_{j1}, \ldots, S_{jN}$ at each node k; and generating the subsidiary equations by utilizing $S_j(k) = f(S_{j0}(k), S_{j1}(k), \ldots, S_{jN}(k), V)$ for each node k of the K nodes.

4. The method of claim 1, wherein the method further comprises:

providing a value V' of V;

for each $PDF_n$ generated, picking a random value of $S_{n0R}$ from $PDF_n$;

for $PDF_n$ not generating, calculating $S_{n0R}$ by substituting $S_{10R}$ into the auxiliary equation $E_n$;

computing values $S_{j1R}, \ldots, S_{jNR}$ of $S_{j1}, \ldots, S_{jN}$, respectively, by substituting $S_{j0R}$ into the subsidiary equations for each subcharacteristic $S_j$ of the J subcharacteristics;

calculating $S_j$ by substituting $S_{j0R}, S_{j1R}, \ldots, S_{jNR}$ and V' into the base equations $S_j = f_j(S_{j0}, S_{j1}, \ldots, S_{jN}, V)$ for each subcharacteristic $S_j$ of the J subcharacteristics;

computing C by substituting $S_1, S_2, \ldots, S_J$ into the combination equation; and outputting the computed C to an output device.

5. The method of claim 1, wherein the method further comprises determining a performance characteristic of a design, said design comprising I nodes in the domain, said I being at least 2, each node of the I nodes having the characteristic C comprising the J subcharacteristics $S_1, S_2, \ldots, S_J$, said I having values of $1, 2, \ldots, I$, said determining a performance characteristic comprising:

randomly selecting a value C(i) of C at each node i of the I nodes, including:

randomly selecting a value $S_j(i)$ of $S_j$ at node i for each subcharacteristic $S_j$ of the J subcharacteristics and computing C(i) by substituting $S_1(i), S_2(i), \ldots, S_J(i)$ into the combination equation for each node i;

determining said performance characteristic, including utilizing said randomly selected $C(1), C(2), \ldots, C(I)$; and outputting the determined performance characteristic, to an output device.

6. The method of claim 5, said randomly selecting $S_j(i)$ at node i for each subcharacteristic $S_j$ of the J subcharacteristics comprising:

providing a value V(i) of V at node i;

for each n such that $PDF_n$ is generating, picking a random value of $S_{n0R}$ from $PDF_j$;

for each n such that $PDF_n$ is not generating calculating $S_{n0R}$ by substituting $S_{10R}$ into the auxiliary equation $E_n$;

calculating corresponding values $S_{j1R}, \ldots, S_{jNR}$ of $S_{j1}, \ldots, S_{jN}$, respectively, by substituting $S_{j0R}$ into the subsidiary equations; and calculating $S_j(i)$ by substituting $S_{j0R}, S_{j1R}, \ldots, S_{jNR}$ and V(i) into the base equation of $S_j$.

7. The method of claim 1, said method further comprising for $n=2, \ldots, J$: determining whether $S_{n0}$ is sufficiently correlated with $S_{10}$, wherein if said determining determines that $S_{n0}$ is not sufficiently correlated with $S_{10}$ then generating said $PDF_n$ but if said determining determines that $S_{n0}$ is sufficiently correlated with $S_{10}$ then not generating said $PDF_n$ and instead deriving said auxiliary equation $E_n$ from scatter data of $S_{n0}$ versus $S_{10}$.

8. The method of claim 7, wherein said determining whether $S_{n0}$ is sufficiently correlated with $S_{10}$ comprises computing a correlation parameter $R_n$ from said scatter data of $S_{n0}$ versus $S_{10}$, said correlation parameter $R_n$ being a square of a correlation coefficient $r_n$ between $S_{n0}$ and $S_{10}$, and wherein $S_{no}$ is sufficiently correlated with $S_{10}$ if $R_n$ is no less than a specified minimum correlation parameter $R_{MIN}$.

9. The method of claim 1, said $f_j$ having a same functional form of V for each subcharacteristic $S_j$ of the J subcharacteristics.

10. The method of claim 1, said $f_j$ being constant with respect to any variation in V for each subcharacteristic $S_j$ of the J subcharacteristics.

11. The method of claim 1, said $f_j$ varying with respect to a variation in V for each subcharacteristic $S_j$ of the J subcharacteristics.

12. The method of claim 1, said $PDF_j$ being a normal probability distribution for at least one subcharacteristic $S_j$ of the J subcharacteristics.

13. The method of claim 1, said domain being a physical domain, said characteristic C being spatially distributed within said physical domain.

14. The method of claim 1, said characteristic C being an electrical characteristic.

15. The method of claim 14, said characteristic C denoting capacitance at a node of the domain, said V denoting a voltage applied to the node.

16. The method of claim 15, said function $f_j$ being a polynomial in V of order N for each subcharacteristic $S_j$ of the J subcharacteristics, said N being at least 5.

17. A computer program product, comprising a computer usable medium having a computer readable program code embodied therein, said computer readable program code adapted to be executed on a processor for implementing a method for modeling a characteristic C that is distributed within a domain, said characteristic C having J subcharacteristics $S_1, S_2, \ldots, S_J$, said method comprising:

storing a combination equation in at least one computer-readable memory device, said base equation expressing C as a function F of the J subcharacteristics, said J being at least 2;

storing base equations in the at least one computer-readable memory device, said base equations expressing $S_j$ as a function $f_j$ of a variable V through use of N+1 parameters $S_{j0}, S_{j1}, \ldots, S_{jN}$, said base equations being of a form $S_j = f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

generating at least one probability density function (PDF) from $PDF_1, PDF_2, \ldots, PDF_J$, said $PDF_n$ describing a probability of occurrence of $S_{n0}$ in accordance with said uncertainty for $n=1, 2, \ldots, J$, said at least one PDF including $PDF_1$;

for each $PDF_n$ not generated: generating an auxiliary equation $E_n$ expressing $S_{n0}$ in terms of $S_{10}$;

generating subsidiary equations expressing $S_{j1}, \ldots, S_{jN}$ in terms of $S_{j0}$ for each subcharacteristic $S_j$ of the J subcharacteristics; and storing the at least one PDF, the auxiliary equations, and the subsidiary equations in the at least one computer-readable memory device, wherein the combination equation, the base equations, the at least one PDF, the auxiliary equations, and the subsidiary equations are adapted to be accessed from the at least one memory device for usage in determining C.

18. The computer program product of claim 17, wherein the method further comprises:

providing a value V' of V;

for each $PDF_n$ generated, picking a random value of $S_{n0R}$ from $PDF_n$;

for $PDF_n$ not generated, calculating $S_{n0R}$ by substituting $S_{10R}$ into the auxiliary equation $E_n$;

computing values $S_{j1R}, \ldots, S_{jNR}$ of $S_{j1}, \ldots, S_{jN}$, respectively, by substituting $S_{j0R}$ into the subsidiary equations for each subcharacteristic $S_j$ of the J subcharacteristics;

calculating $S_j$ by substituting $S_{j0R}, S_{j1R}, \ldots, S_{jNR}$ and V' into the base equations $S_j = f_j(S_{j0}, S_{j1}, \ldots, S_{jN}, V)$ for each subcharacteristic $S_j$ of the J subcharacteristics;

computing C by substituting $S_1, S_2, \ldots, S_J$ into the combination equation; and outputting the computed C to an output device.

19. The computer program product of claim 17, wherein the method further comprises determining a performance characteristic of a design, said design comprising I nodes in the domain, said I being at least 2, each node of the I nodes having the characteristic C comprising the J subcharacteristics $S_1, S_2, \ldots, S_J$, said I having values of $1, 2, \ldots, I$, said determining a performance characteristic comprising:

randomly selecting a value C(i) of C at each node i of the I nodes, including:

randomly selecting a value $S_j(i)$ of $S_j$ at node i for each subcharacteristic $S_j$ of the J subcharacteristics and computing C(i) by substituting $S_1(i), S_2(i), \ldots, S_J(i)$ into the combination equation for each node i;

determining said performance characteristic, including utilizing said randomly selected $C(1), C(2), \ldots, C(I)$; and outputting the determined performance characteristic to an output device.

20. The computer program product of claim 19, said randomly selecting $S_j(i)$ at node i for each subcharacteristic $S_j$ of the J subcharacteristics comprising:

providing a value V(i) of V at node i;

for each n such that $PDF_n$ is generating, picking a random value of $S_{n0R}$ from $PDF_j$;

for each n such that $PDF_n$ is not generated, calculating $S_{n0R}$ by substituting $S_{10R}$ into the auxiliary equation $E_n$;

calculating corresponding values $S_{j1R}, \ldots, S_{jNR}$ of $S_{j1}, \ldots, S_{jN}$, respectively, by substituting $S_{j0R}$ into the subsidiary equations; and calculating $S_j(i)$ by substituting $S_{j0R}, S_{j1R}, \ldots, S_{jNR}$ and V(i) into the base equation of $S_j$.

21. The computer program product of claim 17, said method further comprising for $n=2, \ldots, J$: determining whether $S_{n0}$ is sufficiently correlated with $S_{10}$, wherein if said determining determines that $S_{n0}$ is not sufficiently correlated with $S_{10}$ then generating said $PDF_n$ but if said determining determines that $S_{n0}$ is sufficiently correlated with $S_{10}$ then not generating said $PDF_n$ and instead deriving said auxiliary equation $E_n$ from scatter data of $S_{n0}$ versus $S_{10}$.

22. The computer program product of claim 21, wherein said determining whether $S_{n0}$ is sufficiently correlated with $S_{10}$ comprises computing a correlation parameter $R_n$ from said scatter data of $S_{n0}$ versus $S_{10}$, said correlation parameter $R_n$ being a square of a correlation coefficient $r_n$ between $S_{n0}$ and $S_{10}$, and wherein $S_{n0}$ is sufficiently correlated with $S_{10}$ if $R_n$ is no less than a specified minimum correlation parameter $R_{MIN}$.

23. A computer readable medium comprising a model therein, said model configured to be used by a computer readable program code adapted to be executed on a processor for implementing a method that uses the model for modeling a characteristic C that is distributed within a domain, said model comprising:

a combination equation that expresses C as a function F of the J subcharacteristics, said J being at least 2, said characteristic C being distributed within a domain, said characteristic C having J subcharacteristics $S_1, S_2, \ldots, S_J$;

base equations expressing $S_j$ as a function $f_j$ of a variable V through use of N+1 parameters $S_{j0}, S_{j1}, \ldots, S_{jN}$, said base equations being of a form $S_j = f_j(S_{j0}, S_{j1}, \ldots, S_{jN}, V)$, said N being at least 1, said parameters $S_{j0}, S_{j1}, \ldots, S_{jN}$ being subject to uncertainty, said j having values of $1, 2, \ldots, J$;

at least one probability density function (PDF) from $PDF_1, PDF_2, \ldots, PDF_J$, said $PDF_n$ describing a probability of occurrence of $S_{n0}$ in accordance with said uncertainty for $n=1, 2, \ldots, J$, said at least one PDF including $PDF_1$;

for each $PDF_n$ that does not exist, an auxiliary equation $E_n$ expressing $S_{n0}$ in terms of $S_{10}$; and subsidiary equations expressing $S_{j1}, \ldots, S_{jN}$ in terms of $S_{j0}$ for each subcharacteristic $S_j$ of the J subcharacteristics, said program code comprising code for determining the characteristic C using said model.

24. The computer readable medium of claim 23, further comprising means for using the combination equation, the base equations, the at least one PDF, each auxiliary equation, and the subsidiary equations to calculate a value of C from input comprising a value V' of V.

25. The computer readable medium of claim 23, wherein the program code comprises means for using the combination equation, the base equations, the at least one PDF, each auxiliary equation, and the subsidiary equations to determine a performance characteristic of a design, said design comprising I nodes in the domain, said I being at least 2, each node i of the I nodes having the characteristic C comprising the J subcharacteristics $S_1, S_2, \ldots, S_J$, said i having values of 1, 2, ..., I.

26. The computer readable medium of claim 23, said $f_j$ having a same functional form of V for each subcharacteristic $S_j$ of the J subcharacteristics.

27. The computer readable medium of claim 23, said $f_j$ being constant with respect to any variation in V for each subcharacteristic $S_j$ of the J subcharacteristics.

28. The computer readable medium of claim 23, said $f_j$ varying with respect to a variation in V for each subcharacteristic $S_j$ of the J subcharacteristics.

29. The computer readable medium of claim 23, said $PDF_j$ being a normal probability distribution for at least one subcharacteristic $S_j$ of the J subcharacteristics.

30. The computer readable medium of claim 23, said domain being a physical domain, said characteristic C being spatially distributed within said physical domain.

31. The computer readable medium of claim 30, said characteristic C being an electrical characteristic.

32. The computer readable medium of claim 31, said characteristic C denoting capacitance at a node of the domain, said V denoting a voltage applied to the node.

33. The computer readable medium of claim 32, said function $f_j$ being a polynomial in V of order N for each subcharacteristic $S_j$ of the J subcharacteristics, said N being at least 5.

* * * * *